US008205329B2

(12) United States Patent
Nakamura et al.

(10) Patent No.: US 8,205,329 B2
(45) Date of Patent: Jun. 26, 2012

(54) METHOD FOR MANUFACTURING DIELECTRIC LAYER CONSTITUTING MATERIAL, DIELECTRIC LAYER CONSTITUTING MATERIAL OBTAINED THEREBY; METHOD FOR MANUFACTURING CAPACITOR CIRCUIT FORMING PIECE USING DIELECTRIC LAYER CONSTITUTING MATERIAL, CAPACITOR CIRCUIT FORMING PIECE OBTAINED THEREBY; AND MULTI-LAYER PRINTED WIRING BOARD OBTAINED BY USING DIELECTRIC LAYER CONSTITUTING MATERIAL AND/OR CAPACITOR CIRCUIT FORMING PIECE

(75) Inventors: Kensuke Nakamura, Ageo (JP); Kazuhiro Yamazaki, Ageo (JP)

(73) Assignee: Mitsuimining & Smelting Co., Ltd., Tokyo (JP)

( * ) Notice: Subject to any disclaimer, the term of this patent is extended or adjusted under 35 U.S.C. 154(b) by 1086 days.

(21) Appl. No.: 11/659,948

(22) PCT Filed: Aug. 9, 2005

(86) PCT No.: PCT/JP2005/014592
§ 371 (c)(1),
(2), (4) Date: May 6, 2008

(87) PCT Pub. No.: WO2006/016589
PCT Pub. Date: Feb. 16, 2006

(65) Prior Publication Data
US 2008/0289865 A1    Nov. 27, 2008

(30) Foreign Application Priority Data

Aug. 11, 2004  (JP) ................................. 2004-234872

(51) Int. Cl.
*H05K 3/20*    (2006.01)

(52) U.S. Cl. .......... 29/847; 29/25.41; 29/25.42; 29/846; 29/831

(58) Field of Classification Search ................. 29/25.41, 29/25.42, 846, 847, 831
See application file for complete search history.

(56) References Cited

U.S. PATENT DOCUMENTS

| 4,882,454 | A | * | 11/1989 | Peterson et al. | ............ | 174/252 |
| 6,141,870 | A | * | 11/2000 | McDermott et al. | ............ | 29/852 |
| 6,349,456 | B1 | * | 2/2002 | Dunn et al. | ............ | 29/25.42 |
| 7,444,727 | B2 | * | 11/2008 | Savic et al. | ............ | 29/25.42 |
| 2007/0278661 | A1 | * | 12/2007 | Hsu | ............ | 257/700 |

FOREIGN PATENT DOCUMENTS

JP    8125302 A    5/1996

(Continued)

*Primary Examiner* — Derris Banks
*Assistant Examiner* — Azm Parvez
(74) *Attorney, Agent, or Firm* — Greenblum & Bernstein, P.L.C.

(57) ABSTRACT

An object is to obtain a dielectric layer constituting material, a capacitor circuit forming piece, etc. in which unnecessary dielectric layer is removed except capacitor circuit parts that improve accuracy of position of an embedded capacitor circuit in a multi-layer printed wiring board. For the purpose of achieving the object, "a method for manufacturing a dielectric layer constituting material characterized in that step a is a step for forming a first electrode circuit by etching a conductor layer on one side of a metal clad dielectric comprising a conductor layer on each side of a dielectric layer; step b is a step for removing the dielectric layer that is exposed between the first electrode circuits to manufacture the dielectric layer constituting material; and the step a is conducted and then the step b is conducted" is adopted. Then as a process for manufacturing a capacitor circuit forming piece, the dielectric layer constituting material obtained above is used and a process for forming a second electrode at a position facing the first electrode is conducted.

21 Claims, 24 Drawing Sheets

FOREIGN PATENT DOCUMENTS

| | | | |
|---|---|---|---|
| JP | 9116247 A | 5/1997 | |
| JP | 2000-323845 A | 11/2000 | |
| JP | 2002-9416 A | 1/2002 | |
| JP | 2002-534791 A | 10/2002 | |
| JP | 2003-11270 A | 1/2003 | |
| JP | 2003011270 A | * | 1/2003 |

* cited by examiner

FIGURE 3
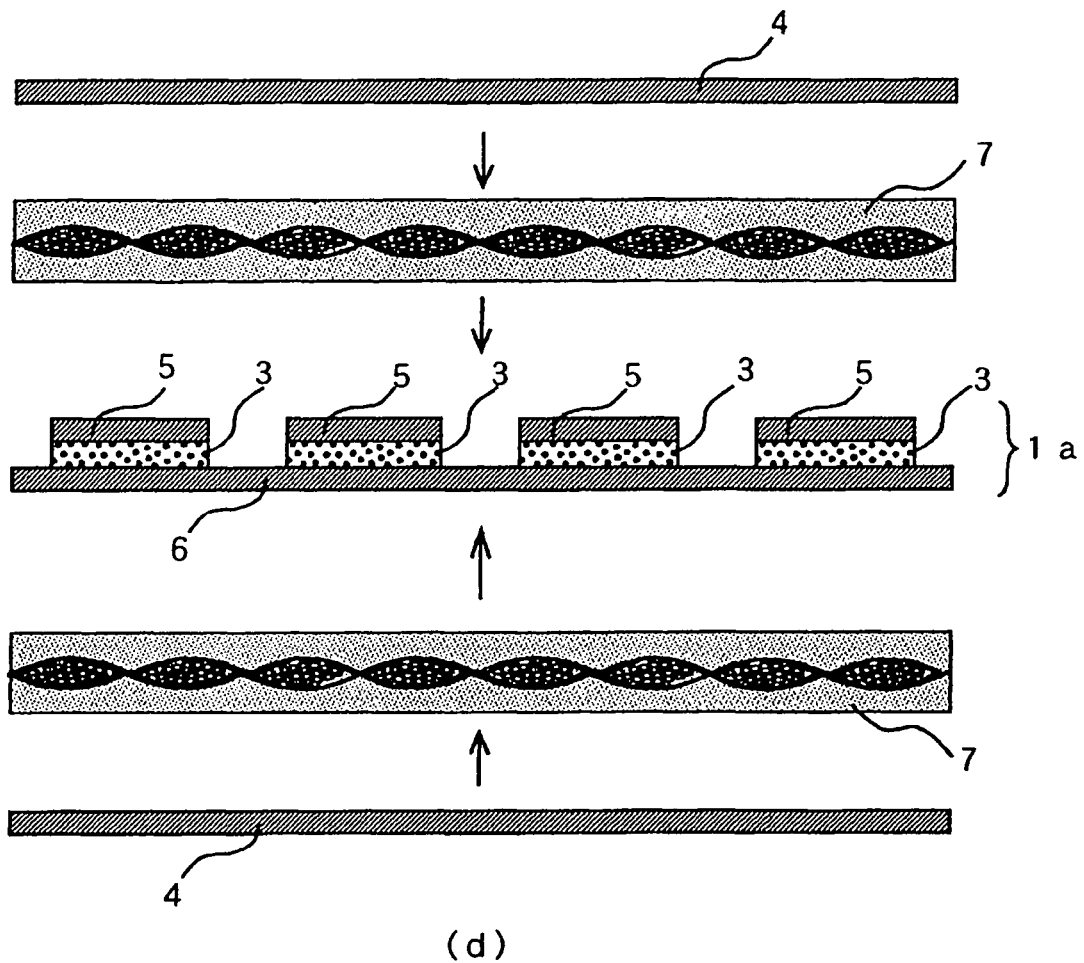
(d)
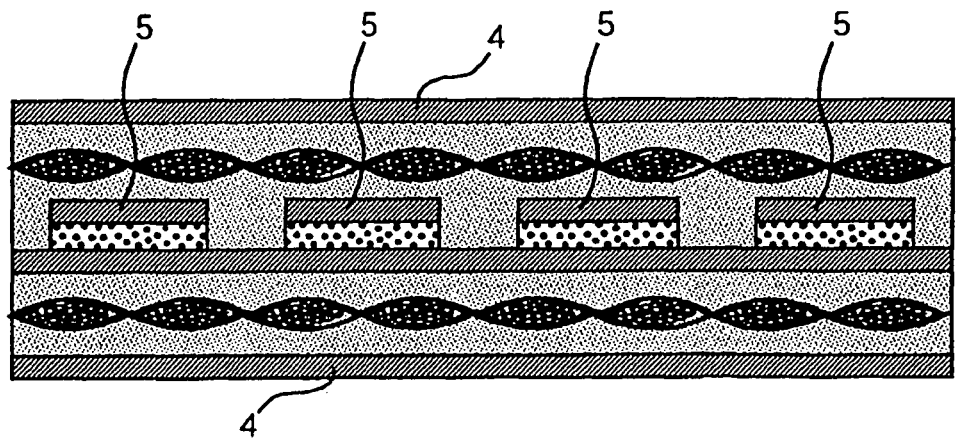
(e)

(f)

FIGURE 5
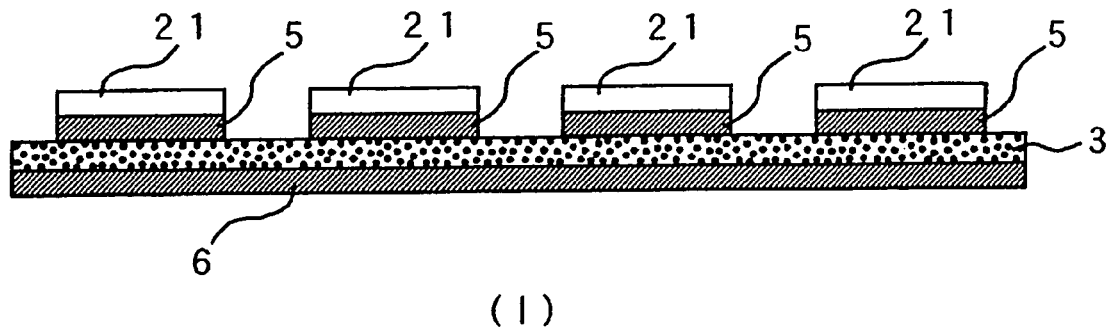
(I)
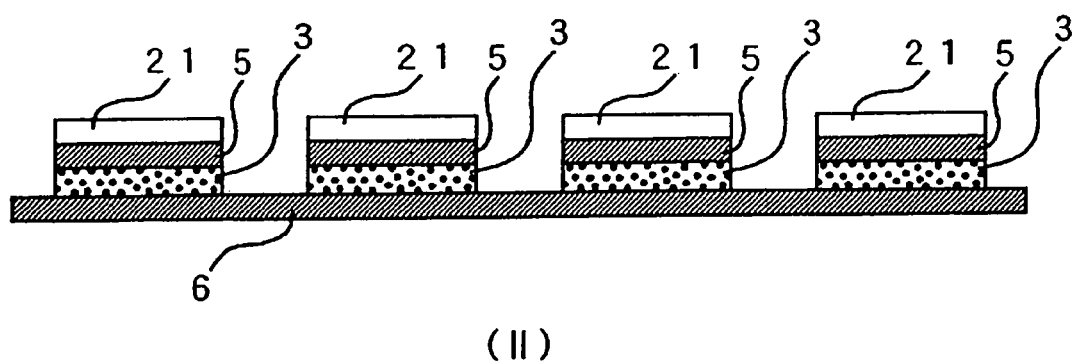
(II)
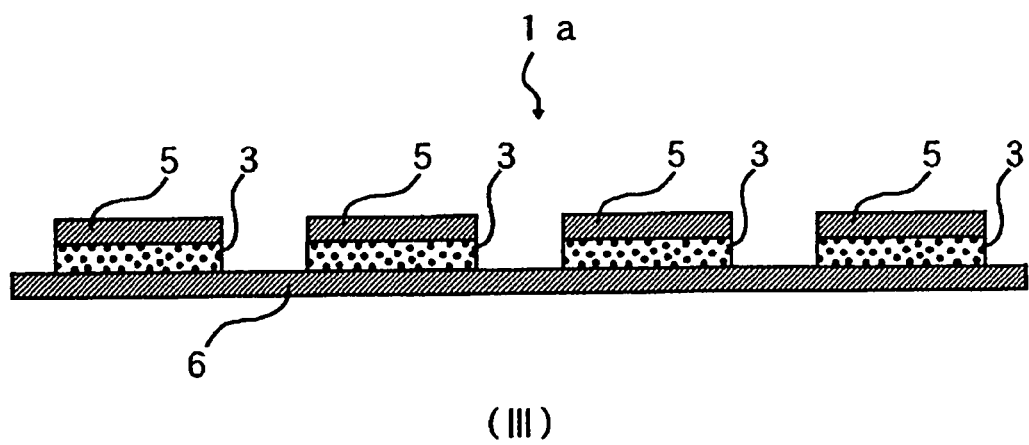
(III)

FIGURE 6
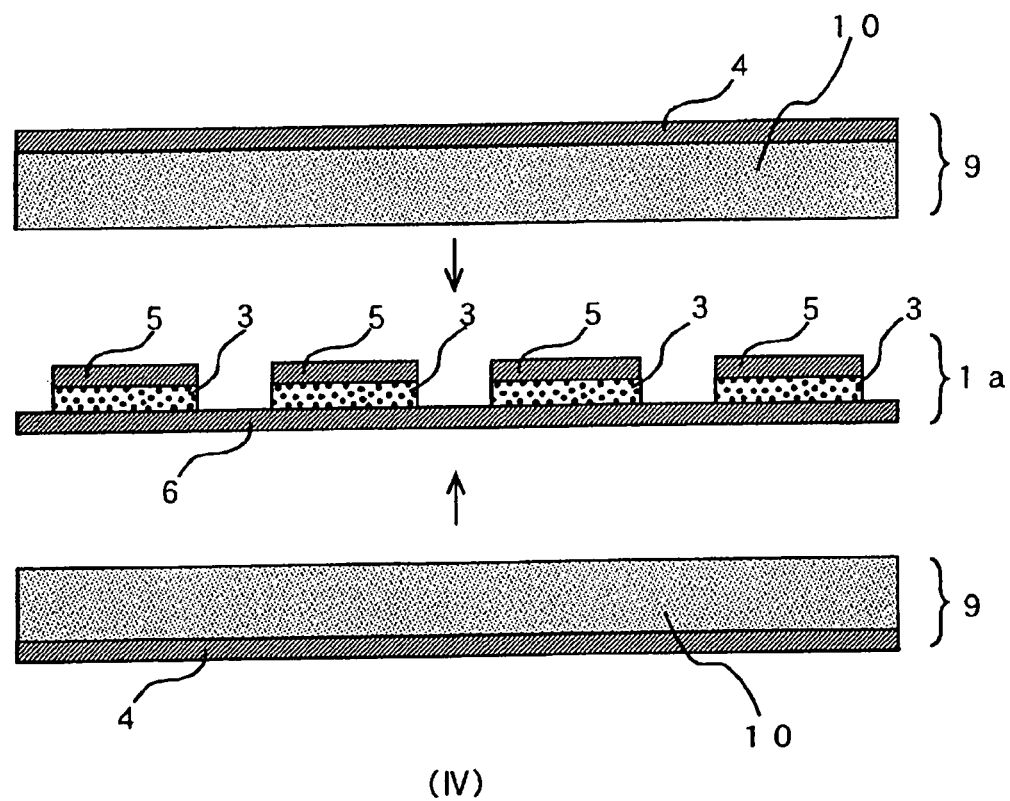
(IV)
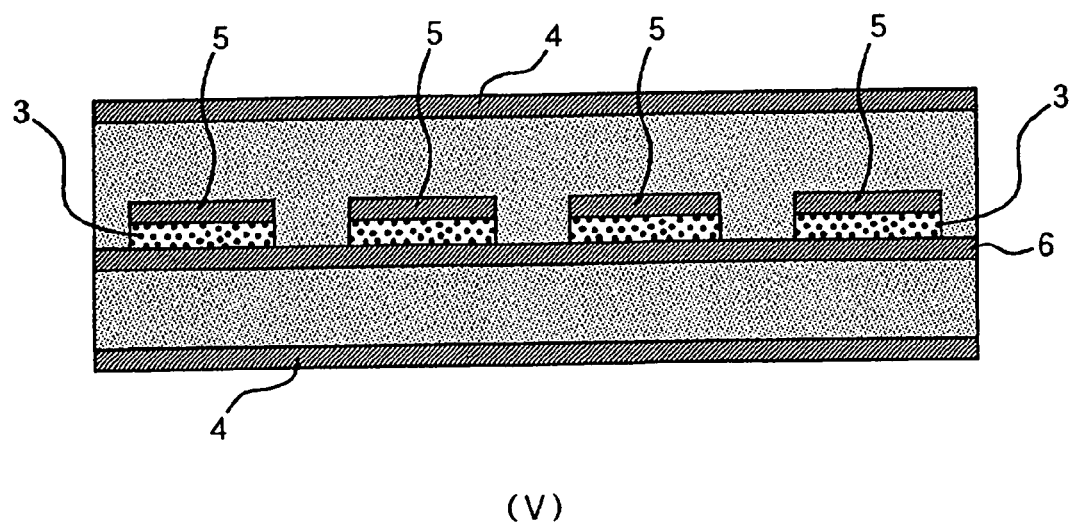
(V)

(VI)

FIGURE 8
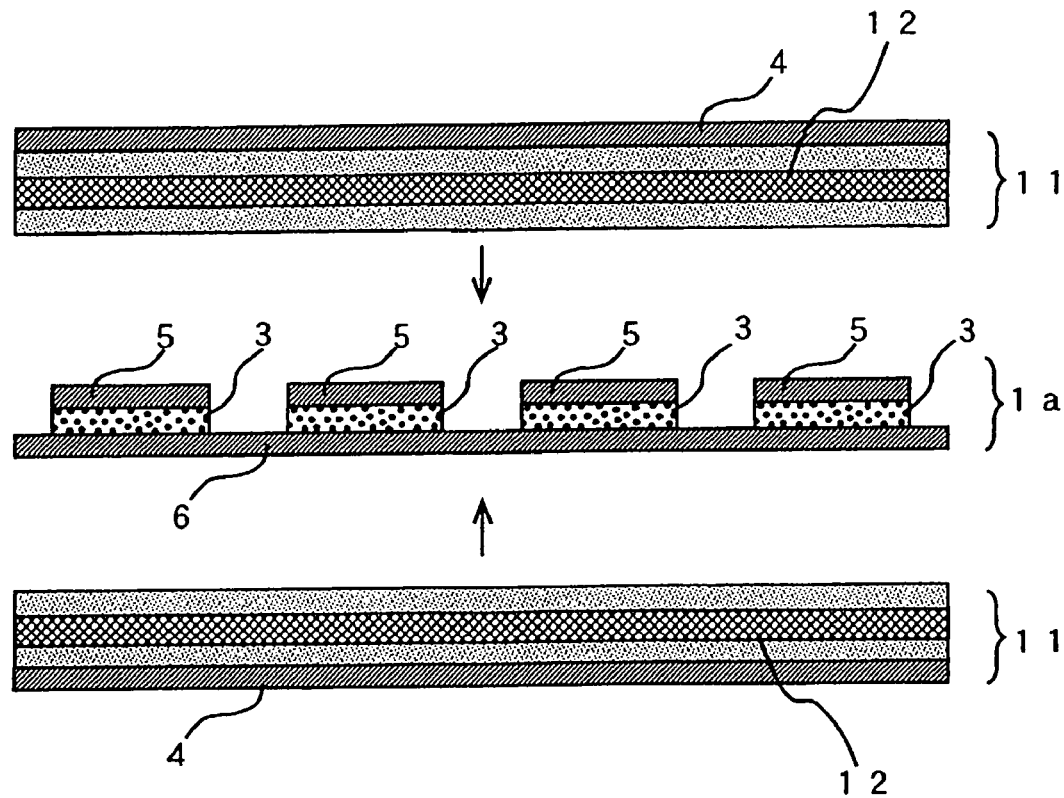
(a)
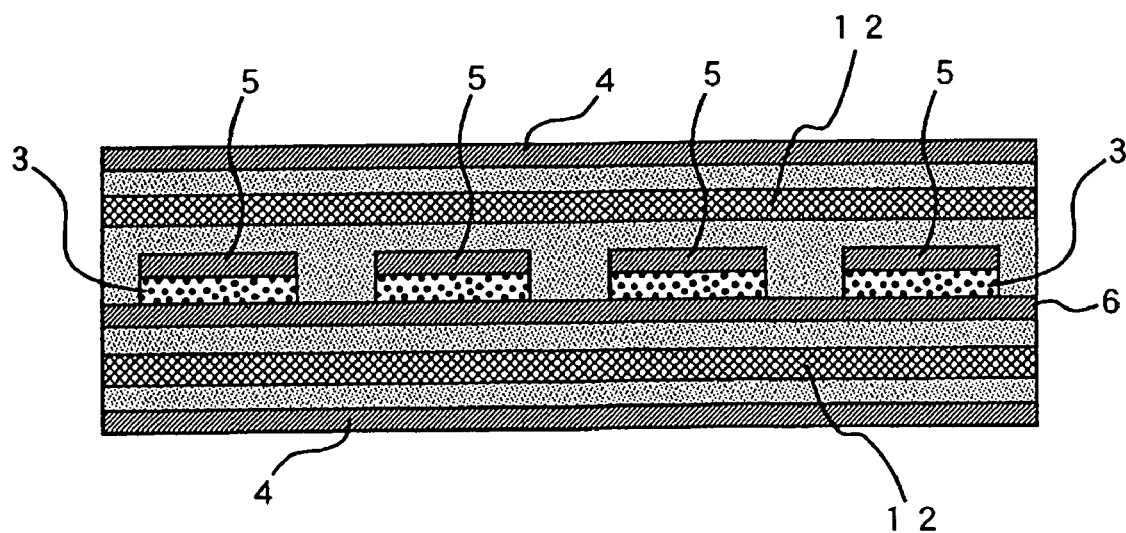
(b)

(c)

FIGURE 10
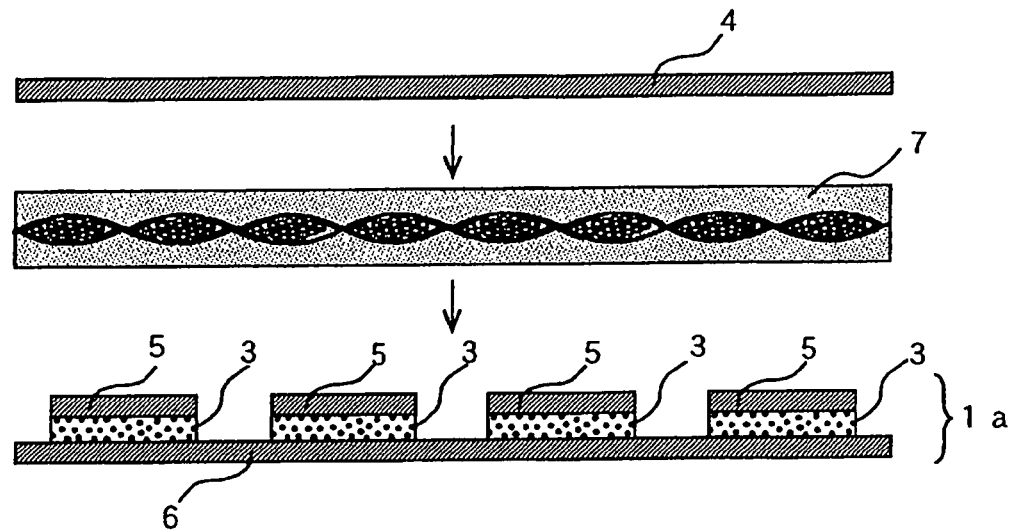
(a)
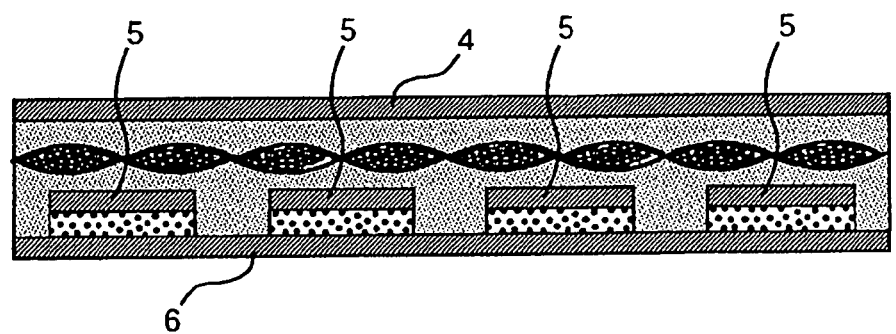
(b)
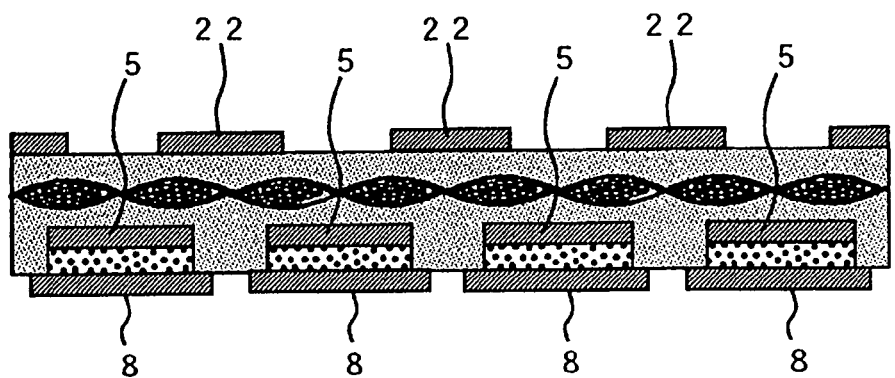
(c)

FIGURE 11
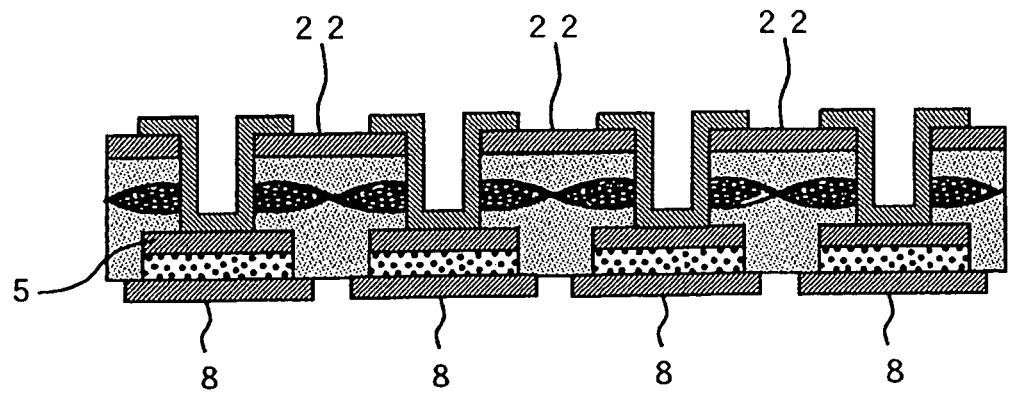
(d)
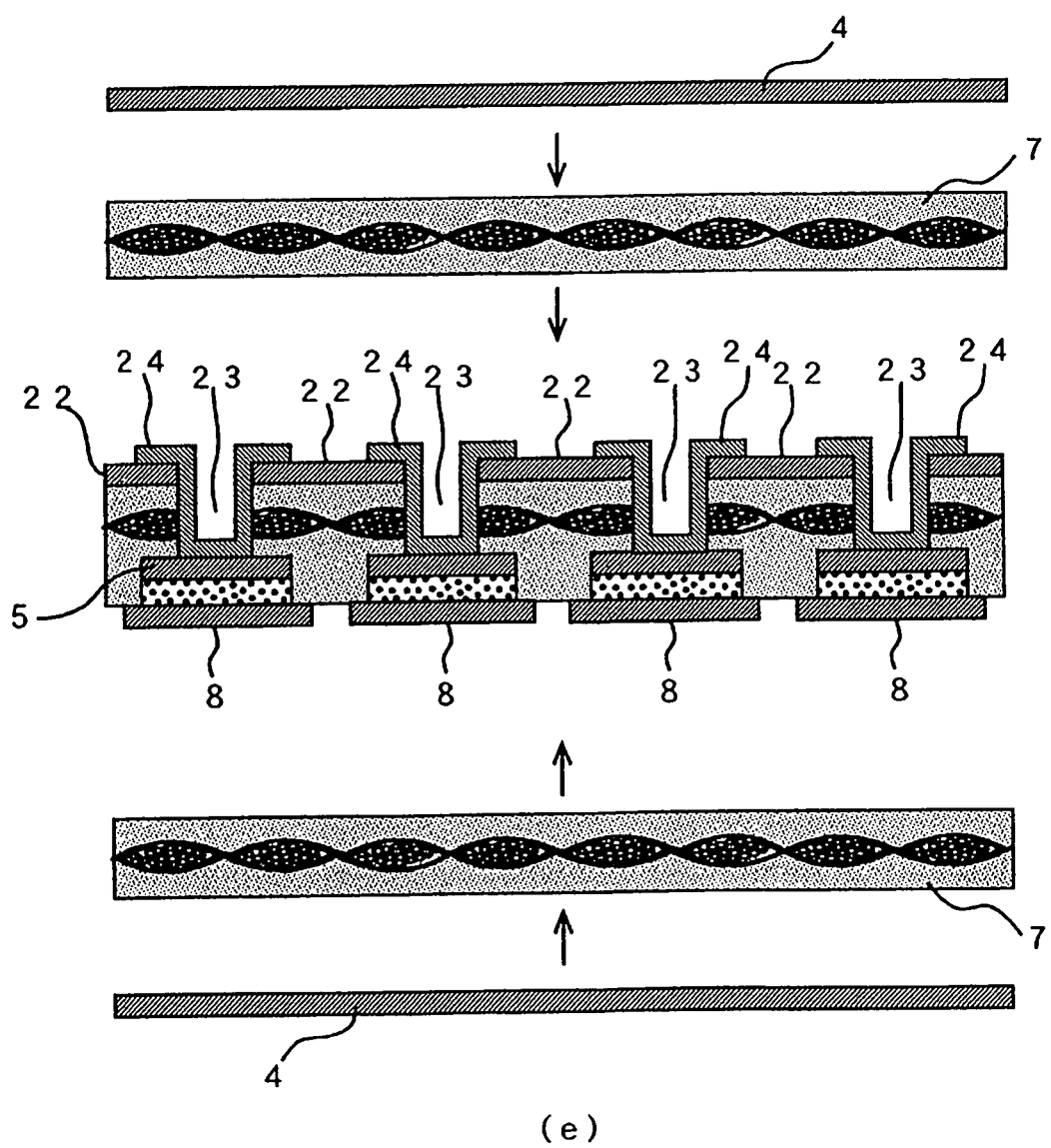
(e)

FIGURE 12
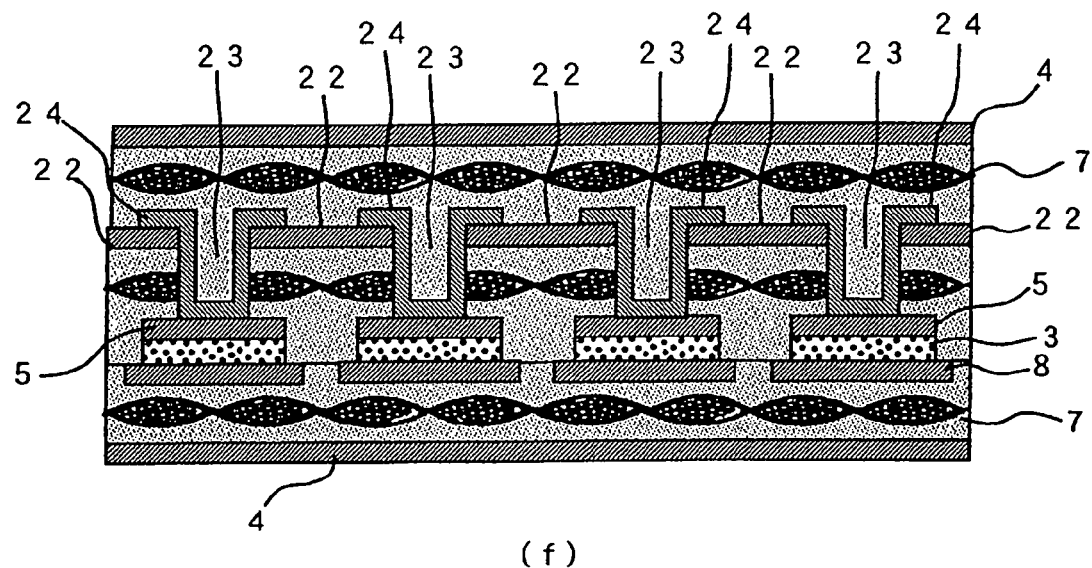
(f)
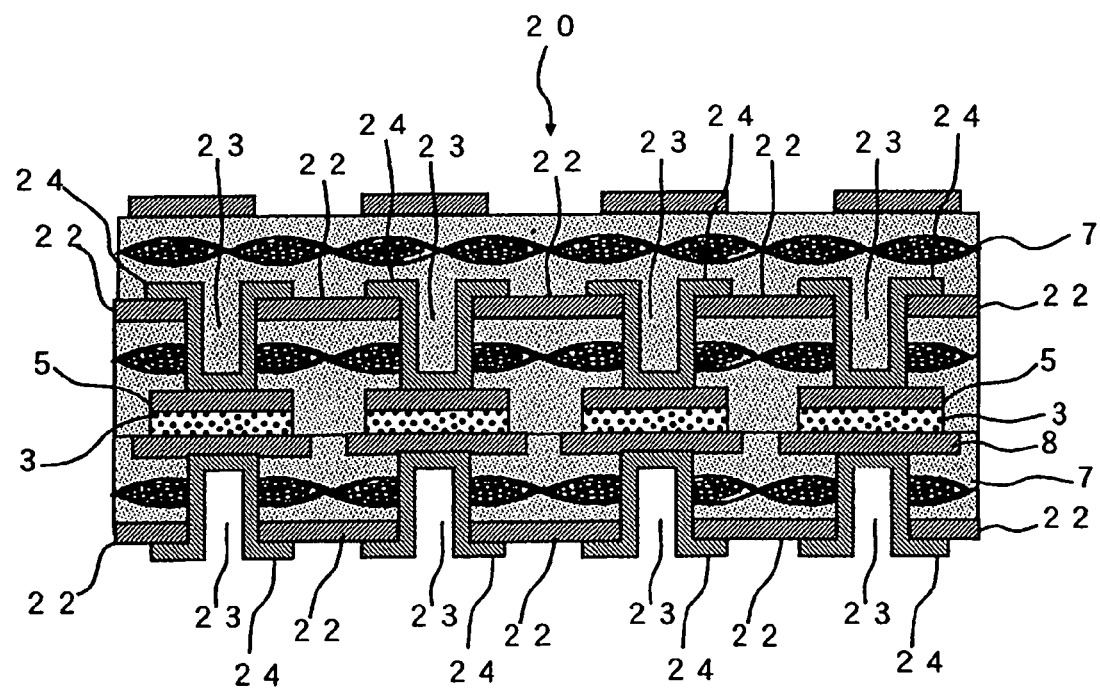
(g)

FIGURE 13
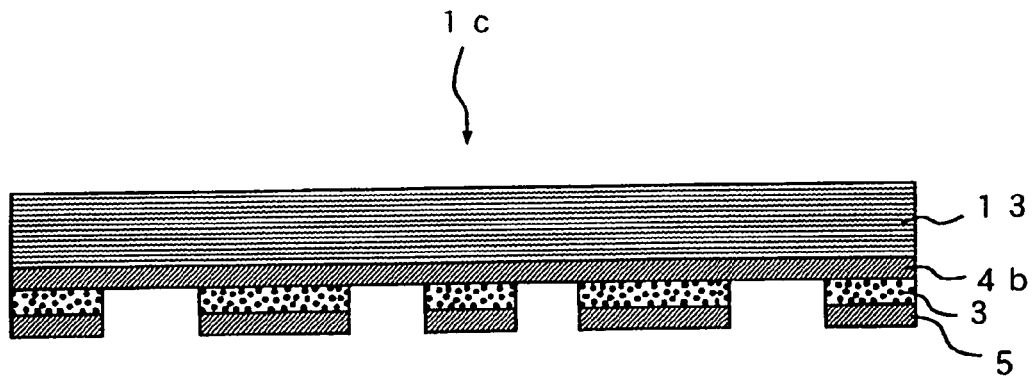
(a)
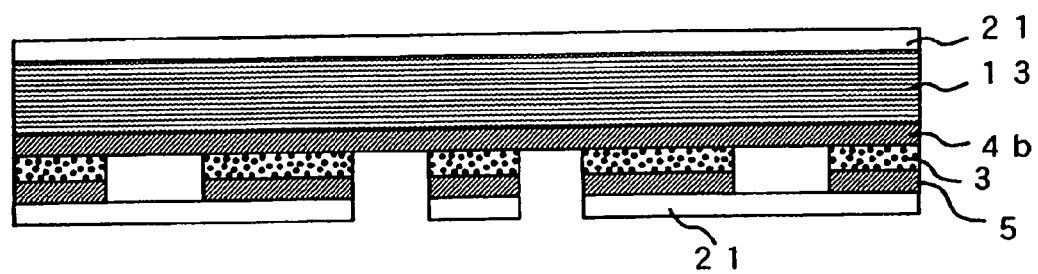
(b)
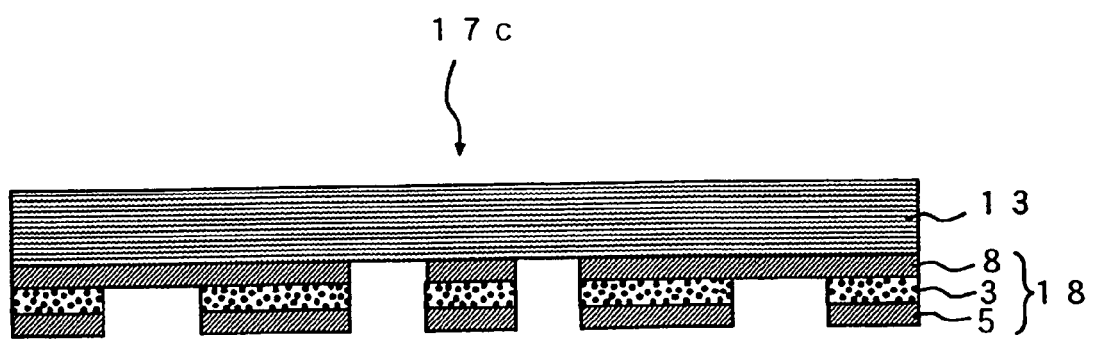
(c)

FIGURE 14
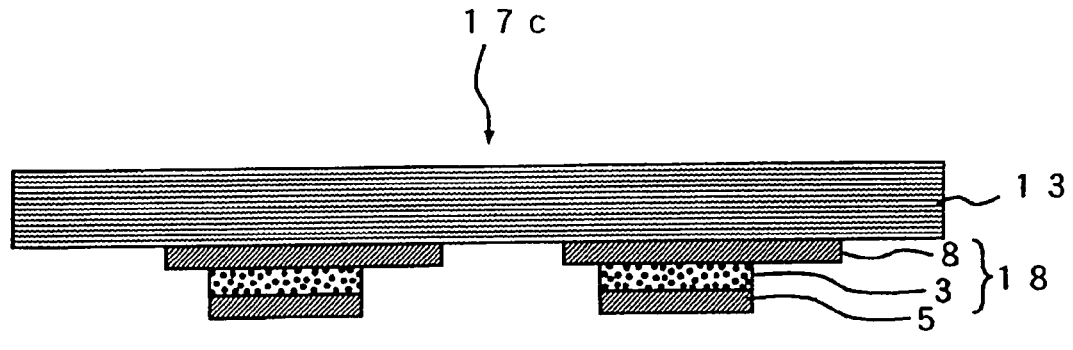
(a)
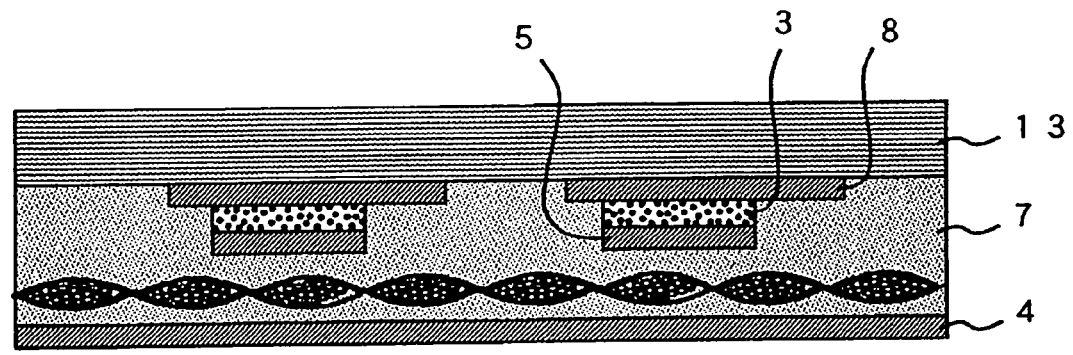
(b)
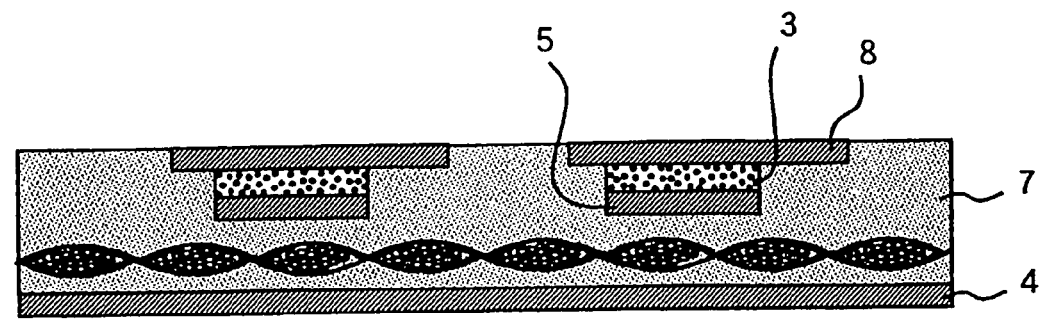
(c)

FIGURE 16
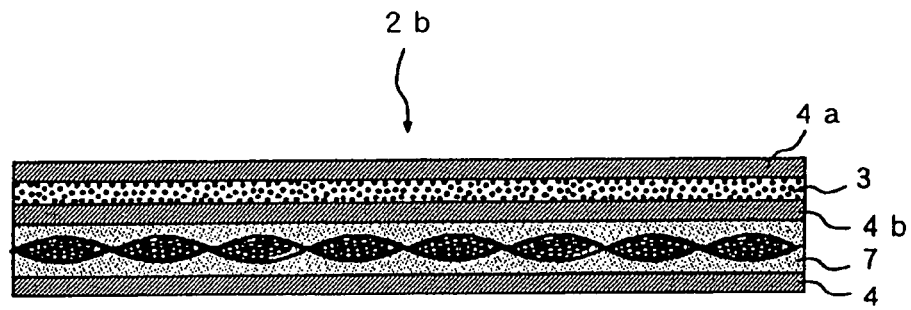
(a)
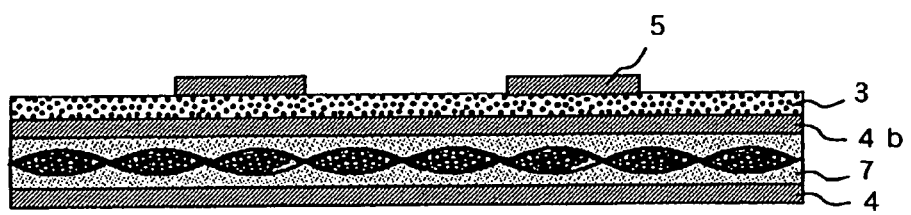
(b)
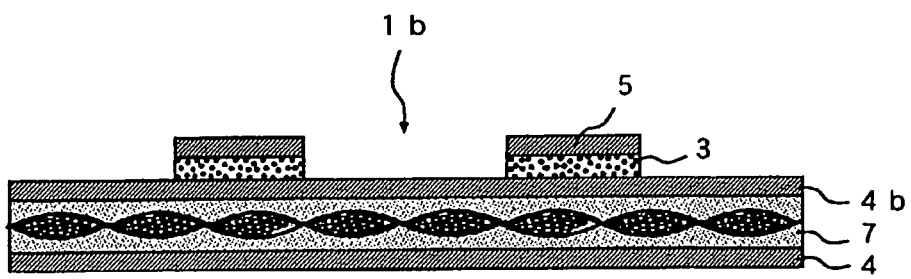
(c)
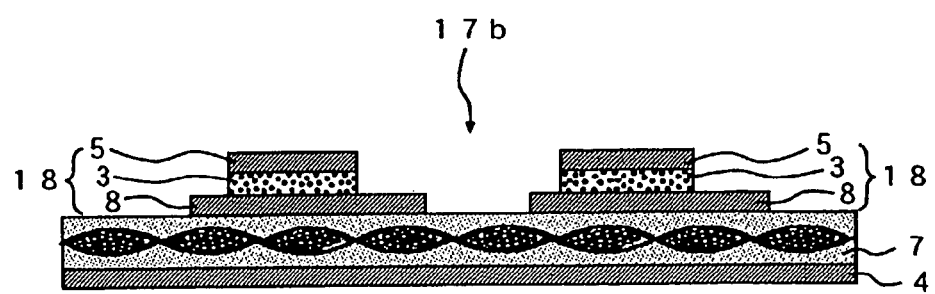
(d)

FIGURE 17
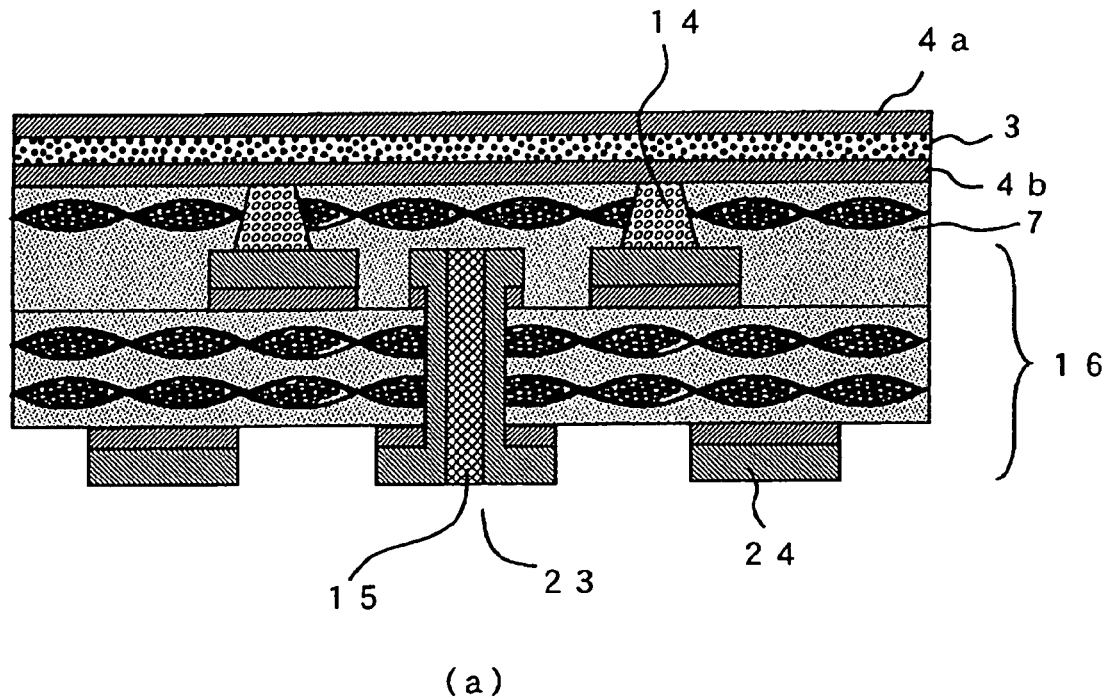
(a)
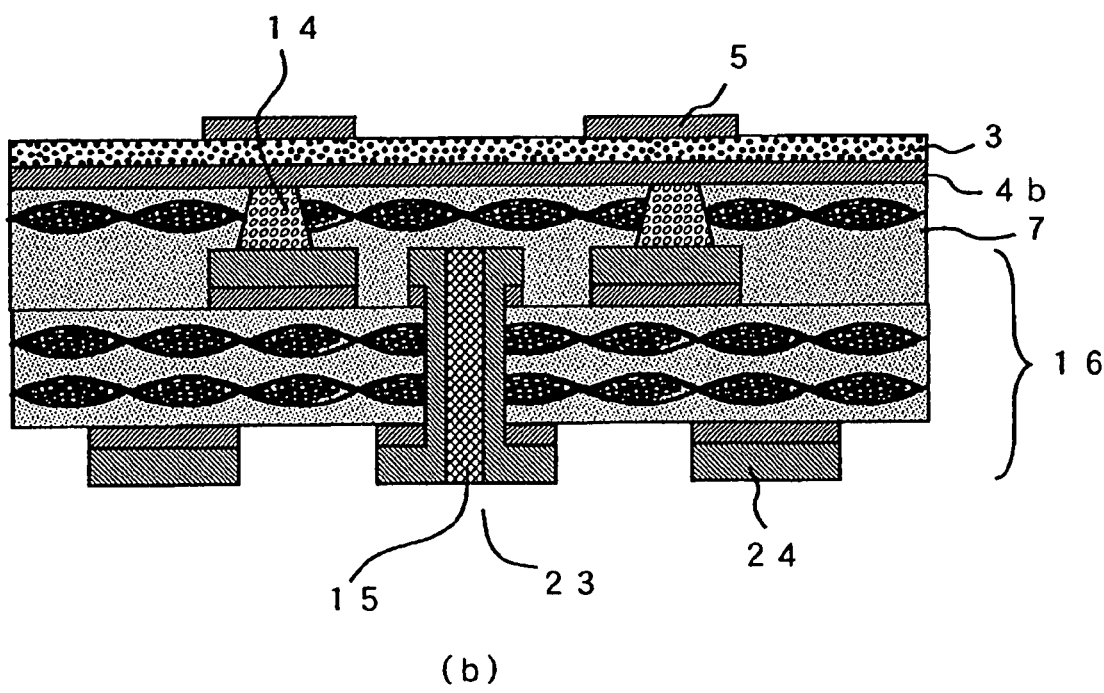
(b)

FIGURE 18
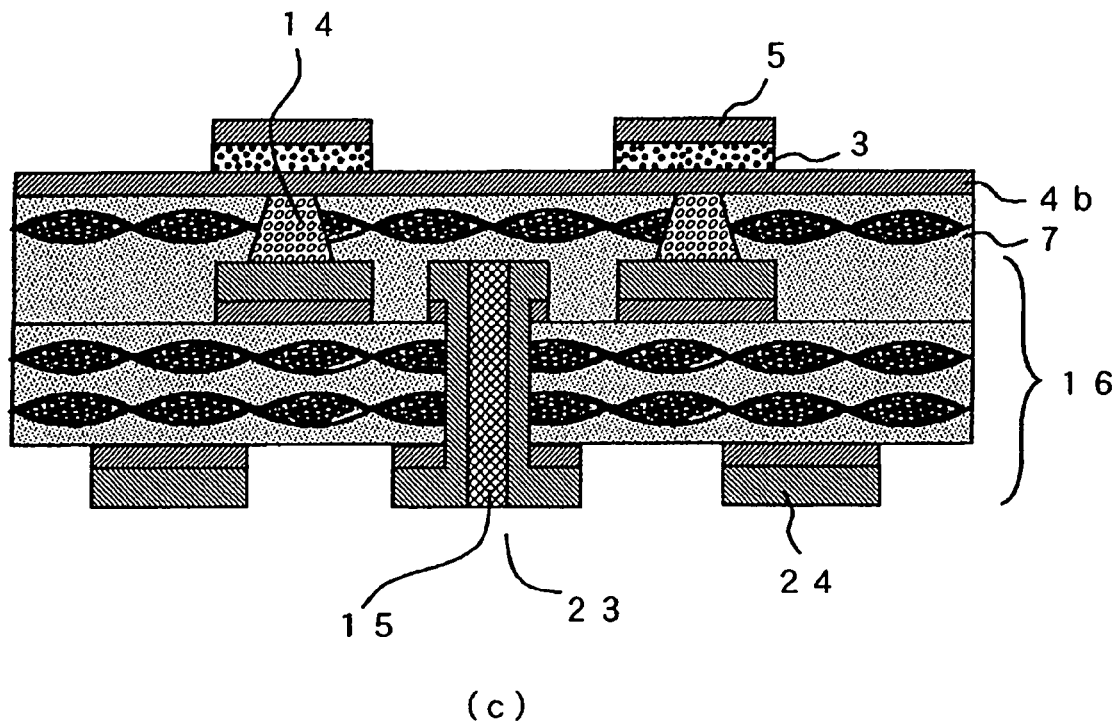
(c)
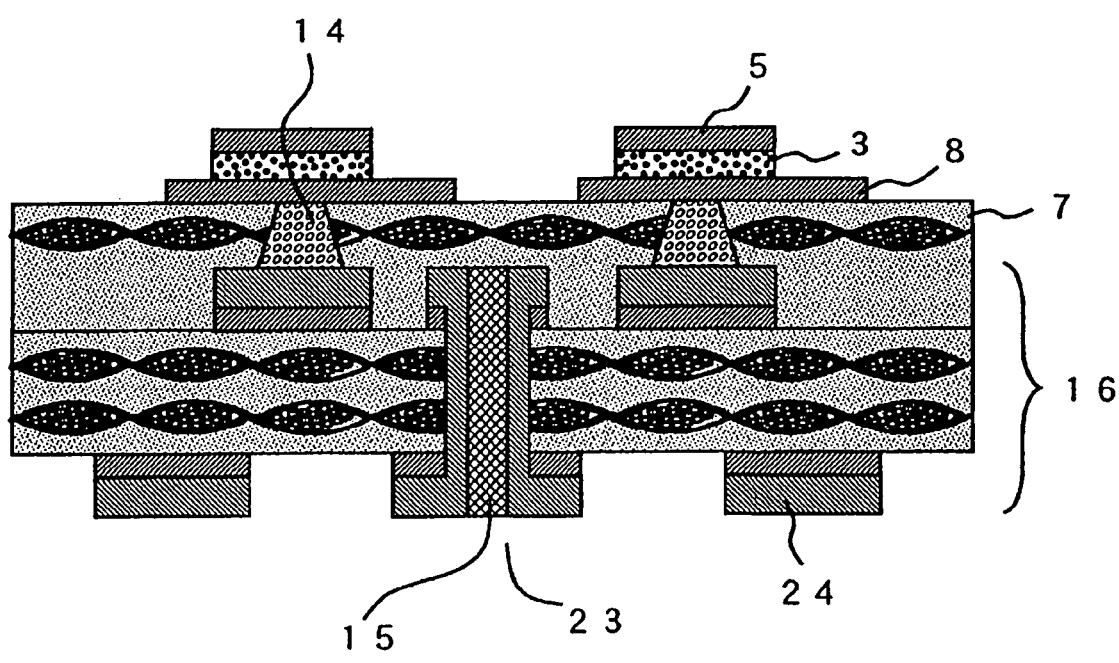
(d)

FIGURE 20
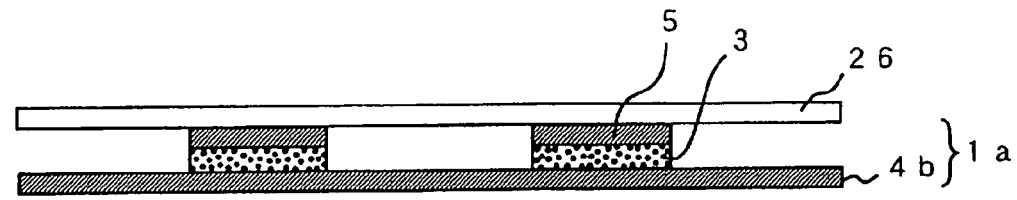
(a)
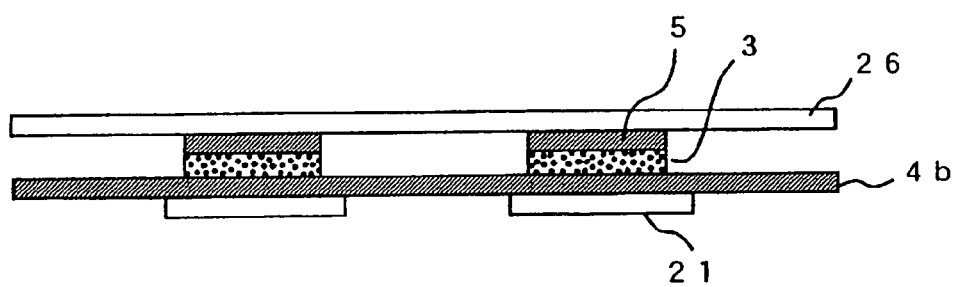
(b)
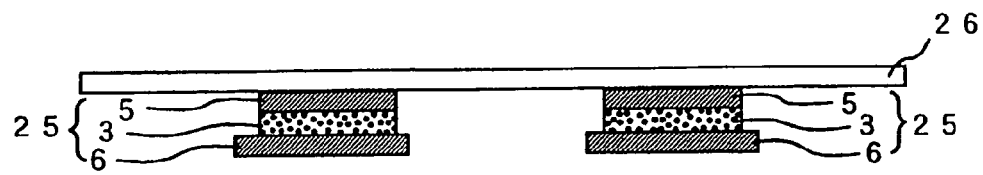
(c)
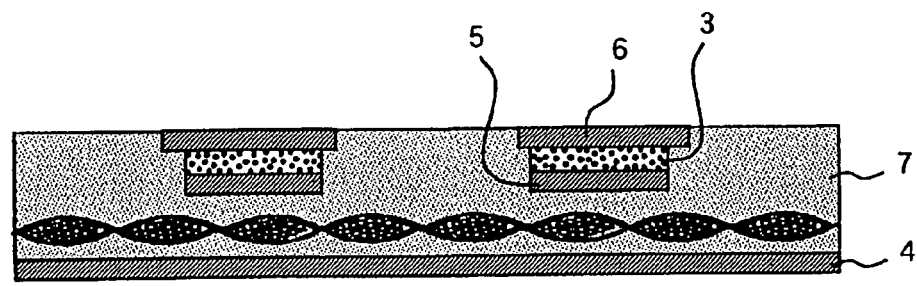
(d)

FIGURE 21
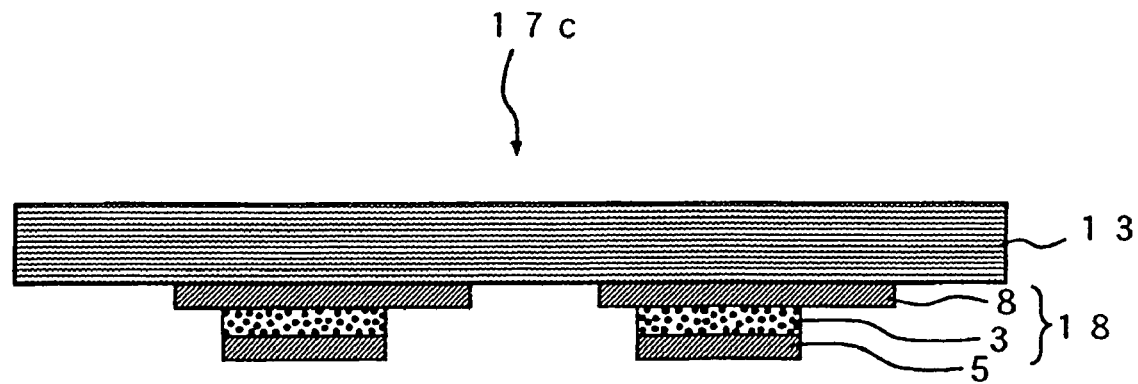
(a)
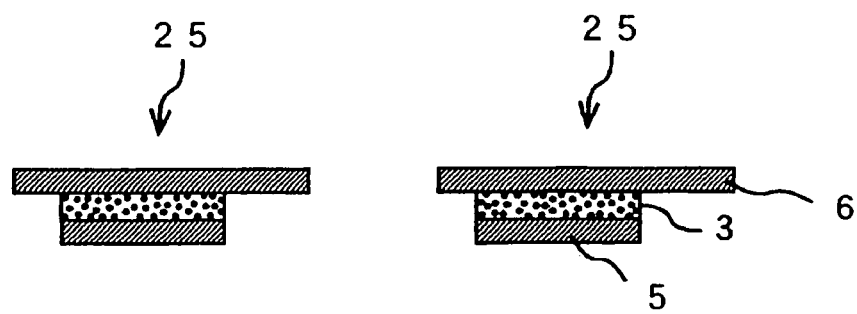
(b)
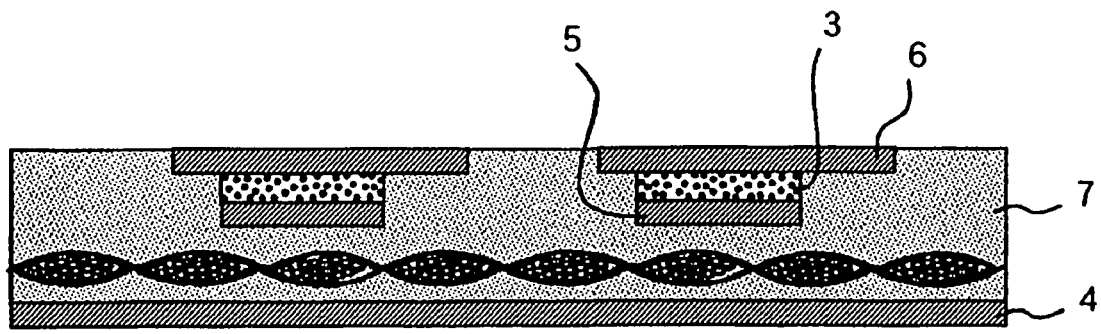
(c)

FIGURE 23
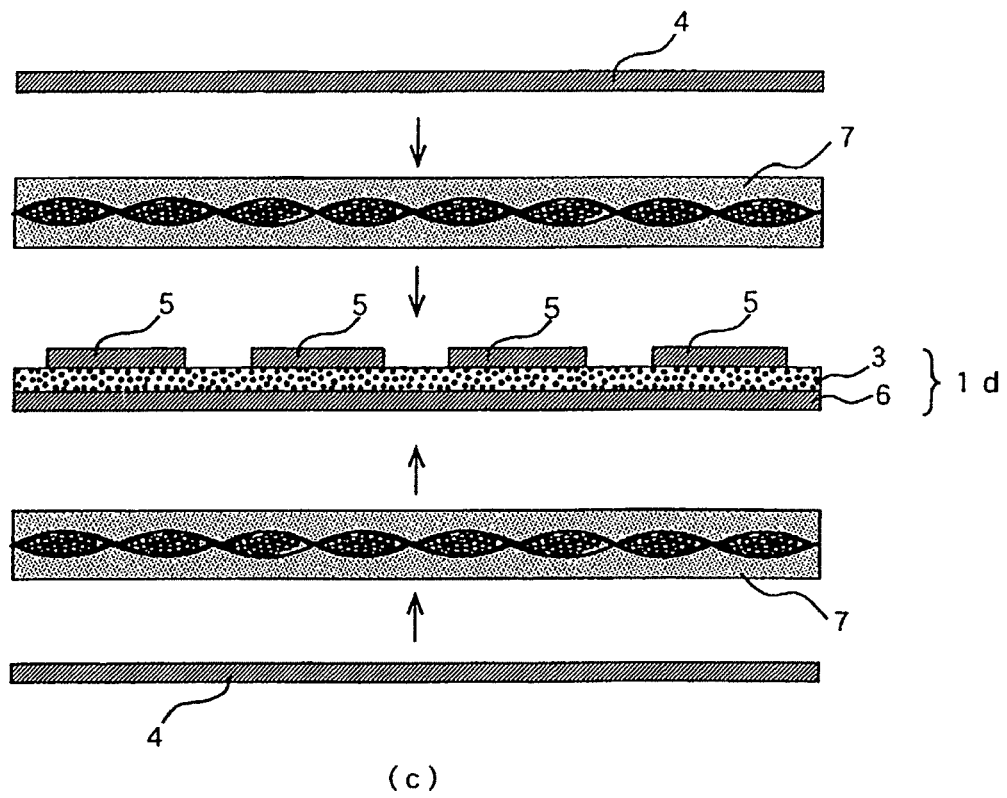
(c)
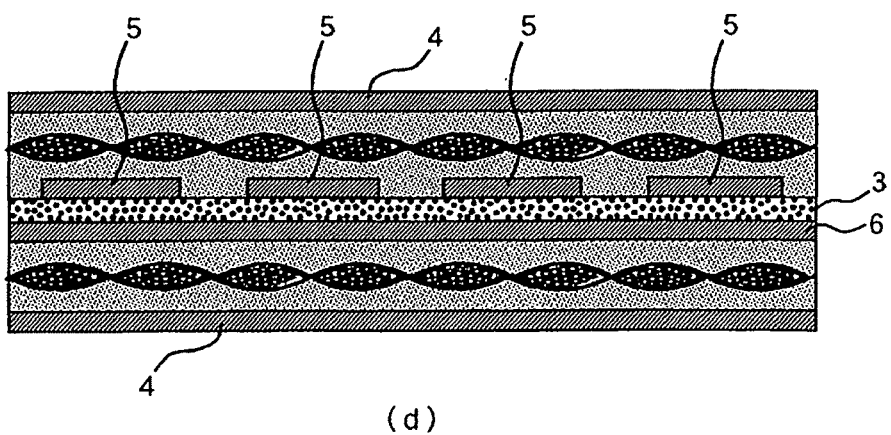
(d)

(e)

METHOD FOR MANUFACTURING DIELECTRIC LAYER CONSTITUTING MATERIAL, DIELECTRIC LAYER CONSTITUTING MATERIAL OBTAINED THEREBY; METHOD FOR MANUFACTURING CAPACITOR CIRCUIT FORMING PIECE USING DIELECTRIC LAYER CONSTITUTING MATERIAL, CAPACITOR CIRCUIT FORMING PIECE OBTAINED THEREBY; AND MULTI-LAYER PRINTED WIRING BOARD OBTAINED BY USING DIELECTRIC LAYER CONSTITUTING MATERIAL AND/OR CAPACITOR CIRCUIT FORMING PIECE

CROSS REFERENCE TO RELATED APPLICATION

This application is a 35 USC §371 National Phase Entry Application from PCT/JP2005/014592, filed Aug. 9, 2005, and designating the United States.

TECHNICAL FIELD

The present invention provides a method for manufacturing a dielectric layer constituting material, a dielectric layer constituting material obtained by the method; a method for manufacturing a capacitor circuit forming piece by using the dielectric layer constituting material, a capacitor circuit forming piece obtained by the method; and a multi-layer printed wiring board with an embedded capacitor circuit manufactured by using the dielectric layer constituting material and/or the capacitor circuit forming piece.

BACKGROUND ART

Conventionally, a multi-layer printed wiring board with an embedded capacitor circuit uses one or more insulating layer(s) locating in the inner layer of the board as dielectric layer(s). An inner layer circuit locating on each side of the dielectric layer includes a capacitor: a first electrode circuit and a second electrode circuit, which face each other. Therefore, such a capacitor circuit is sometimes referred to as an embedded capacitor circuit.

Such a multi-layer printed wiring board with an embedded capacitor circuit has been manufactured by adopting a manufacturing method shown in FIG. 22 to FIG. 24. As shown in FIG. 22(a), a dielectric layer constituting material (a metal clad dielectric 2a) having a conductor layer 4 on each side of a dielectric layer 3 is used. The conductor layer 4 on one side is etched to form a first electrode circuit 5 to obtain the state shown in FIG. 22(b). At this time, the dielectric layer is exposed in areas except where the first electrode circuit 5 is formed. And the side which is substantially not subjected to the etching at this time works as a second electrode circuit 6.

Then as shown in FIG. 23(c), a prepreg 7 and a metal foil 4 are laminated to each side of the dielectric layer constituting material 1d in which the first electrode circuit 5 is formed, to give the state shown in FIG. 23(d). After that, metal layers 4 locating at outer layers are processed to be outer layer circuits 22 by etching etc. to obtain a four-layer multi-layer printed wiring board with embedded capacitor 20' shown in FIG. 24(e).

The method for manufacturing a multi-layer printed wiring board with an embedded capacitor circuit shown in FIG. 22 to FIG. 24 has a dielectric layer spreading all over the multi-layer printed wiring board, and the dielectric layer exists around power supply lines and signal transfer lines as well as the capacitor circuit. This dielectric layer causes a problem of increasing dielectric loss at transferring signals etc. due to high dielectric constant of the dielectric layer. Moreover, the dielectric layer usually introduces some restrictions on circuit design because it is often impossible to bury other circuit devices such as an inductor in the dielectric layer.

Therefore, in order to form the dielectric layer only in area that require the dielectric layer, those skilled in the art have adopted methods such as burying a high dielectric constant material in perforated positions of a dielectric layer provided on the surface of an inner layer substrate as disclosed in Patent Document 1 (Japanese Patent Laid-Open No. 09-116247); transferring a layer with a capacitor circuit previously formed on a resin film to the surface of an inner layer core material as disclosed in Patent Document 2 (Japanese Patent Laid-Open No. 2000-323845); or printing dielectric filler containing paste by screen printing method as disclosed in Patent Document 3 (Japanese Patent Laid-Open No. 08-125302).

Patent Document 1: Japanese Patent Laid-Open No. 09-116247

Patent Document 2: Japanese Patent Laid-Open No. 2000-323845

Patent Document 3: Japanese Patent Laid-Open No. 08-125302

However, the inventions disclosed in Patent Document 1 (Japanese Patent Laid-Open No. 09-116247), Patent Document (Japanese Patent Laid-Open No. 2000-323845) and Patent Document 3 (Japanese Patent Laid-Open No. 08-125302) almost always cause lack of film thickness uniformity of the dielectric layer, a problem regarding accuracy of position in transferring method and screen printing method, and dielectric strength tests of a capacitor layer has to be conducted for end products, even though the inventions may solve the state remaining of the dielectric layer in unnecessary area.

The capacitor is required to have an electric capacity as large as possible as a fundamental quality thereof. The capacity (C) of a capacitor is calculated with the formula $C = \epsilon \epsilon_0 (A/d)$ ($\epsilon_0$ is the dielectric constant of vacuum). Improvement of the surface area (A) is obviously has a limit. This is because there is an increasing demand for downsized printed wiring boards in conformity with the particularly recent downsizing trend of electronic and electric equipments, and it is almost impossible to make the area of the capacitor electrode larger in a certain limited area of a printed wiring board. Accordingly, for the purpose of increasing the capacity of a capacitor, it is necessary to make the thickness (d) of the dielectric layer thinner, when the surface area (A) of the capacitor electrode and relative dielectric constant ($\epsilon$) of the dielectric layer are constant. Therefore, lack of film thickness uniformity cause deviation in quality of capacitors, which is not preferable.

Moreover, problems in accuracy of position in transferring method and screen printing method causes deviation between positions of formed first electrode and second electrode, which decreases effective area of the surface area (A) that determines an electric capacity of a capacitor. Thus capacitor properties as originally designed cannot be obtained, and product quality becomes out of specification.

Then there has been a demand for techniques for manufacturing a multi-layer printed wiring board and a multi-layer printed wiring board with an embedded capacitor circuit in which electric characteristics with stability are assured by excellent accuracy of position of capacitor circuits, and removal of unnecessary dielectric layer that exists in area except for capacitor circuit positions.

DISCLOSURE OF THE INVENTION

The inventors of the present invention have thoroughly studied. As a result, they have found a method for manufacturing a multi-layer printed wiring board with an excellent embedded capacitor circuit by using a dielectric layer constituting material obtained by the following manufacturing method and a capacitor circuit forming piece manufactured with the dielectric layer constituting material.

[A Method for Manufacturing a Dielectric Layer Constituting Material According to the Present Invention]

A method for manufacturing a dielectric layer constituting material used for an embedded capacitor circuit of a multi-layer printed wiring board according to the present invention is characterized by comprising the following step a and step b.

Step a is a step for forming a first electrode circuit by using a metal clad dielectric comprising a three-layer structure of a first conductor layer/a dielectric layer/a second conductor layer, and etching the first conductor layer to form the first electrode circuit. Step b is a step for removing the dielectric layer exposed among the first electrode circuits to manufacture dielectric layer constituting material.

Step b is a step for removing the dielectric layer exposed among the first electrode circuits to manufacture a capacitor circuit forming piece.

And as for the metal clad dielectric used in the step a, the dielectric layer constituting material is also preferably manufactured by using a five-layer structure metal clad dielectric comprising a three-layer structure of a first conductor layer/a dielectric layer/a second conductor layer, and a third conductor layer across an insulating layer on the second conductor layer.

Furthermore, as for the metal clad dielectric used in the step a, the dielectric layer constituting material is also preferably manufactured by using a four-layer structure metal clad dielectric comprising a three-layer structure of a first conductor layer/a dielectric layer/a second conductor layer, and a carrier on the second conductor layer.

And the step for removing the dielectric layer is preferably conducted by a method of using chemical reaction to dissolve and remove the dielectric layer exposed among the first electrode circuits, in particular, a desmear treatment is preferably used.

The step for removing the dielectric layer is also preferably conducted by a method using machining technique to remove the dielectric layer exposed among the first electrode circuits, in particular, a blasting treatment is preferably used.

[A Method for Manufacturing a Capacitor Circuit Forming Piece According to the Present Invention]

A method for manufacturing a capacitor circuit forming piece according to the present invention includes the following three manufacturing methods.

The first method is a method for manufacturing a chip-shaped capacitor circuit forming piece, characterized by manufacturing a dielectric layer constituting material by the method described above using a metal clad dielectric comprising a three-layer structure of a first conductor layer/a dielectric layer/a second conductor layer; and further removing unnecessary area of the second conductor layer of the dielectric layer constituting material to form a second electrode circuit.

The second method is a method for manufacturing a sheet-shaped capacitor circuit forming piece comprising a layer structure of a capacitor circuit layer/an insulating layer/a third conductor layer, characterized by manufacturing a dielectric layer constituting material by the method described above using a metal clad dielectric comprising a five-layer structure of a first conductor layer/a dielectric layer/a second conductor layer/an insulating layer/a third conductor layer; and further removing unnecessary area of the second conductor layer of the dielectric layer constituting material to form a second electrode circuit.

The third method is a method for manufacturing a sheet-shaped capacitor circuit forming piece comprising a layer structure of a capacitor circuit layer/a carrier layer, which is characterized by manufacturing a dielectric layer constituting material by the method described above using a metal clad dielectric comprising a four-layer structure of a first conductor layer/a dielectric layer/a second conductor layer/a carrier layer; and further removing unnecessary area of the second conductor layer of the dielectric layer constituting material to form a second electrode circuit.

[A Dielectric Layer Constituting Material According to the Present Invention]

A dielectric layer constituting material according to the present invention is roughly divided into three types. Accordingly, the material will be separately described in the three types.

The first dielectric layer constituting material is obtained by the method for manufacturing a dielectric layer constituting material described above using a metal clad dielectric comprising a three-layer structure of a first conductor layer/a dielectric layer/a second conductor layer, and which is characterized in that the material comprises a layer structure of a first electrode circuit, the dielectric layer under the first electrode circuit, and the second conductor layer.

The second dielectric layer constituting material is obtained by the method for manufacturing a dielectric layer constituting material described above using a metal clad dielectric comprising a five-layer structure of a first conductor layer/a dielectric layer/a second conductor layer/an insulating layer/a third conductor layer, and which is characterized in that the material comprises a layer structure of a first electrode circuit, the dielectric layer under the first electrode circuit, the second conductor layer, the insulating layer and the third conductor layer.

The third dielectric layer constituting material is obtained by the method for manufacturing a dielectric layer constituting material described above using a metal clad dielectric comprising a four-layer structure of a first conductor layer/a dielectric layer/a second conductor layer/a carrier layer, and which is characterized in that the material comprises a layer structure of a first electrode circuit, the dielectric layer under the first electrode circuit, the second conductor layer, and the carrier layer.

[A Capacitor Circuit Forming Piece According to the Present Invention]

A capacitor circuit forming piece according to the present invention is roughly divided into three types as with the dielectric layer constituting material because the capacitor circuit forming piece is obtained by further processing the dielectric layer constituting material described above.

The first capacitor circuit forming piece is chip-shaped, which is obtained in a state of being separated individually by manufacturing a dielectric layer constituting material by the method described above using a metal clad dielectric comprising a three-layer structure of a first conductor layer/a dielectric layer/a second conductor layer; and further removing unnecessary area of the second conductor layer of the dielectric layer constituting material to form a second electrode circuit.

The second capacitor circuit forming piece is sheet-shaped, and comprises a layer structure of a capacitor circuit layer/an insulating layer/a third conductor layer, which is obtained by manufacturing a dielectric layer constituting material by the method described above using a metal clad dielectric comprising a five-layer structure of a first conductor layer/a dielectric layer/a second conductor layer/an insulating layer/a third conductor layer; and further removing unnecessary area of the second conductor layer of the dielectric layer constituting material to form a second electrode circuit.

The third capacitor circuit forming piece is sheet-shaped, and comprises a layer structure of a capacitor circuit layer/a carrier layer, which is obtained by manufacturing a dielectric layer constituting material by the method described above using a metal clad dielectric comprising a four-layer structure of a first conductor layer/a dielectric layer/a second conductor layer/a carrier layer; and further removing unnecessary area of the second conductor layer of the dielectric layer constituting material to form a second electrode circuit.

[A Multi-Layer Printed Wiring Board with an Embedded Capacitor Circuit According to the Present Invention]

A multi-layer printed wiring board with an embedded capacitor circuit can be manufactured by popular methods by using a dielectric layer constituting material and/or a capacitor circuit forming piece according to the present invention. Such a multi-layer printed wiring board is a product with an embedded capacitor circuit with high quality.

The quality of a multi-layer printed wiring board with an embedded capacitor circuit, which is an end product using a dielectric layer constituting material according to the present invention, is dramatically improved because the dielectric layer constituting material obtained by the method for manufacturing a dielectric layer constituting material described above has no unnecessary area of a dielectric layer.

A method for manufacturing a dielectric layer constituting material and a capacitor circuit forming piece manufactured by using the dielectric layer constituting material according to the present invention is for the purposes of providing a dielectric layer constituting material and a capacitor circuit forming piece that have no dielectric layer in area that do not require the dielectric layer. Manufacturing a multi-layer printed wiring board by using such a dielectric layer constituting material and a capacitor circuit forming piece decreases dielectric loss at transferring signals in a signal circuit close to a capacitor circuit, enables burying other circuit devices such as an inductor, and enables considerably to be free from limiting conditions in circuit design. Therefore, use of a dielectric layer constituting material and a capacitor circuit forming piece obtained by the manufacturing method provides a multi-layer printed wiring board with an embedded capacitor circuit with extremely high quality.

BRIEF DESCRIPTION OF THE DRAWINGS

FIG. 3 is a schematic view showing flow for manufacturing a multi-layer printed wiring board with an embedded capacitor circuit;

FIG. 5 is a schematic view showing procedures of a method for removing a dielectric layer in the case of using a blasting treatment;

FIG. 6 is a schematic view showing flow for manufacturing a multi-layer printed wiring board with an embedded capacitor circuit (in the case of laminating a resin coated metal foil to each side of a dielectric layer constituting material);

FIG. 8 is a schematic view showing flow for manufacturing a multi-layer printed wiring board with an embedded capacitor circuit (in the case of laminating a resin coated metal foil with skeletal material to each side of a dielectric layer constituting material);

FIG. 10 is a schematic view showing flow for manufacturing a multi-layer printed wiring board with an embedded capacitor circuit;

FIG. 11 is a schematic view showing flow for manufacturing a multi-layer printed wiring board with an embedded capacitor circuit;

FIG. 12 is a schematic view showing flow for manufacturing a multi-layer printed wiring board with an embedded capacitor circuit;

FIG. 13 is a schematic view showing flow for manufacturing a sheet-shaped capacitor circuit forming piece;

FIG. 14 is a schematic view showing flow for manufacturing a multi-layer printed wiring board with an embedded capacitor circuit in which a second electrode is buried in an insulating layer;

FIG. 16 is a schematic view showing flow for manufacturing a sheet-shaped capacitor circuit forming piece in which a third conductor layer is bonded to form a carrier layer;

FIG. 17 is a schematic view showing flow for manufacturing a capacitor circuit forming piece after forming carrier layer by laminating a metal clad dielectric to an inner layer core material with connecting each other;

FIG. 18 is a schematic view showing flow for manufacturing a capacitor circuit forming piece after forming carrier layer by laminating a metal clad dielectric to an inner layer core material with connecting each other;

FIG. 20 is a schematic view showing flow for manufacturing a multi-layer printed wiring board with an embedded capacitor circuit providing a resin film carrier on the side of a first electrode and forming a second electrode;

FIG. 21 is a schematic view showing flow for manufacturing a multi-layer printed wiring board with an embedded capacitor circuit using a sheet-shaped capacitor circuit forming piece having a carrier on the side of a second electrode;

FIG. 23 is a schematic view showing flow for manufacturing a multi-layer printed wiring board with an embedded capacitor circuit according to a conventional method.

DESCRIPTION OF SYMBOLS

Figure 1:
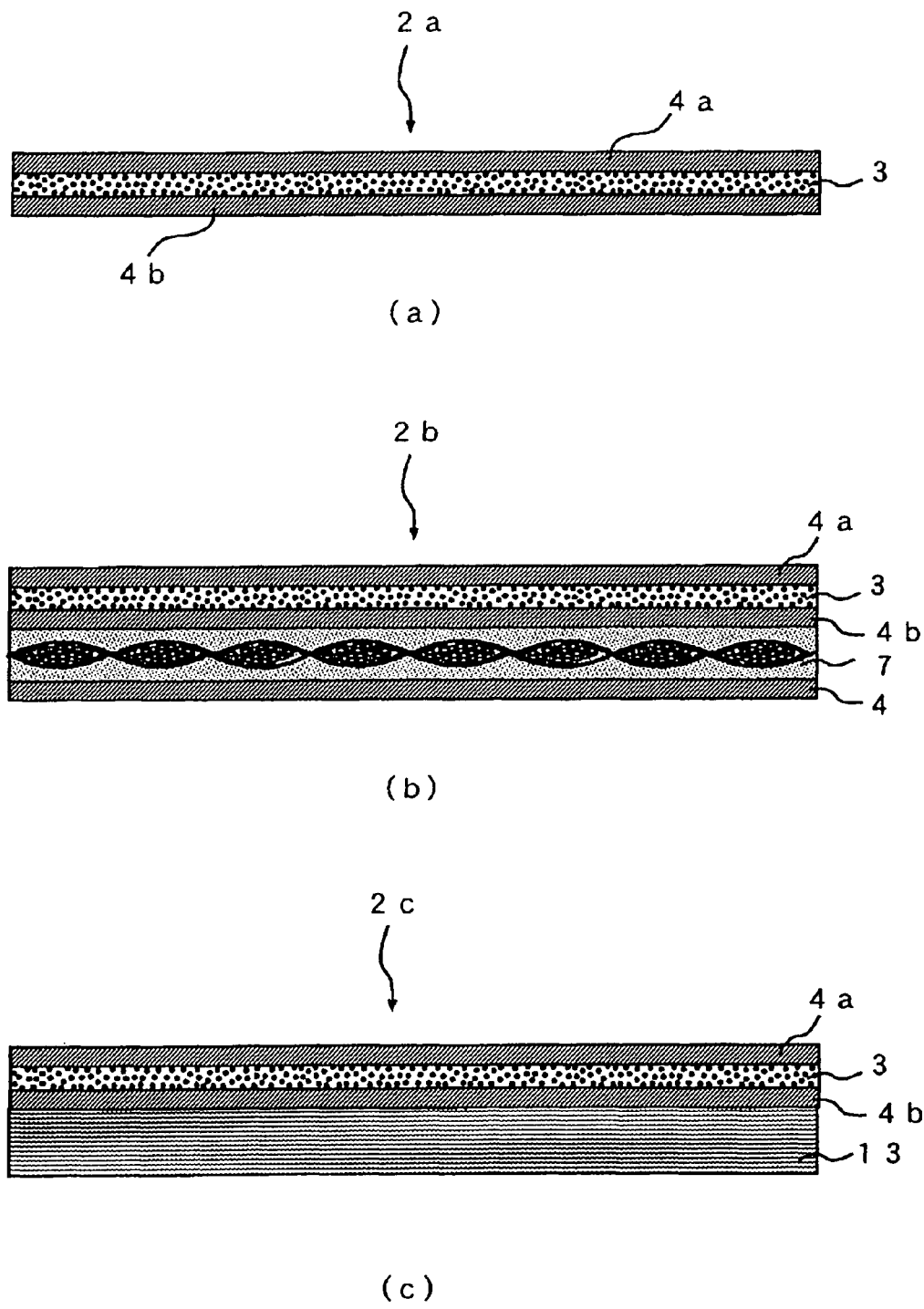
FIG. 1 is a schematic sectional view of variations in metal clad dielectrics used in the present invention in terms of a layer structure.

Reference characters 1a, 1b, 1c and 1d denote dielectric layer constituting materials;

Reference characters 2a, 2b and 2c denote metal clad dielectrics;

Reference numeral 3 denotes a dielectric layer;

Reference numeral 4 denotes a third conductor layer (a metal layer);

Reference character 4a denotes a first conductor layer;

Reference character 4b denotes a second conductor layer;

Reference numeral 5 denotes a first electrode circuit;

Reference numeral 6 denotes a second electrode circuit;

Reference numeral 7 denotes an insulating layer (including a prepreg);

Reference numeral 8 denotes a lower electrode (which is a second electrode circuit);

Reference numeral 9 denotes a resin coated metal foil;

Reference numeral 10 denotes a resin layer of a resin coated metal foil;

Reference numeral 11 denotes a resin coated metal foil with skeletal material;

Reference numeral 12 denotes a skeletal material;

Reference numeral 13 denotes a carrier layer;

Reference numeral 15 denotes a pierced via hole;

Reference numeral 16 denotes a core material;

Reference characters 17b and 17c denote sheet-shaped capacitor circuit forming pieces;

Reference numeral 18 denotes a capacitor circuit layer;

Reference numeral 20 denotes a multi-layer printed wiring board;

Reference numeral 21 denotes an etching resist layer;

Reference numeral 22 denotes an outer layer circuit;

Reference numeral 23 denotes a via hole;

Reference numeral 24 denotes a plated layer;

Reference numeral 25 denotes a chip-shaped capacitor circuit forming piece; and

Reference numeral 26 denotes a resin carrier.

BEST MODE FOR CARRYING OUT THE INVENTION

Hereinafter, the present invention will be described in more detail with reference to embodiments and examples according to the present invention.

[Embodiments for Manufacturing a Dielectric Layer Constituting Material]

A method for manufacturing a dielectric layer constituting material for forming an embedded capacitor circuit of a multi-layer printed wiring board according to the present invention is characterized by comprising the following step a and step b. With reference to the drawings, a typical method for manufacturing a dielectric layer constituting material and typical steps to process the material into a multi-layer printed wiring board will be explained. Incidentally, thickness of each layer in the schematic sectional views used for explaining the present invention does not reflect the actual product thickness, but is depicted in an exaggerated manner enabling an easy understanding of the explanation.

Step a: a step for forming a first electrode circuit by using a metal clad dielectric comprising a three-layer structure of a first conductor layer/a dielectric layer/a second conductor layer, and etching the first conductor layer to form the first electrode circuit.

"A metal clad dielectric" described here is not restricted to a dielectric in which a metal foil is laminated to each side of a dielectric layer obtained by mixing a dielectric filler with an organic agent and applying it. The metal clad dielectric may be obtained by forming a metal layer on each side of the dielectric layer by a sputtering treatment or electroless plating; or forming a dielectric layer on a metal layer by techniques such as sol-gel method or anodization, and then a metal layer is formed on the other side of the dielectric layer by a sputtering treatment or electroless plating. Moreover, a carrier layer etc. may be provided in view of improving the convenience of handling.

That is, the metal clad dielectric 2 used in the step a comprises a three-layer structure of a first conductor layer 4a/a dielectric layer 3/a second conductor layer 4b as shown in FIG. 1(a), and the metal clad dielectric 2a having the three-layer structure is the basic structure. Furthermore, the metal clad dielectric 2 also comprises the following layer structures.

As the metal clad dielectric used in the step a, a five-layer structure metal clad dielectric comprising a three-layer structure of a first conductor layer/a dielectric layer/a second conductor layer, and a third conductor layer across an insulating layer on the second conductor layer: the first conductor layer 4a/the dielectric layer 3/the second conductor layer 4b/the insulating layer 7/the third conductor layer 4, may also be used. A schematic view of a sectional layer structure of this metal clad dielectric is shown in FIG. 1(b). Use of a metal clad dielectric 2b with such a layer structure allows the layer of an insulating layer/a third conductor layer to constitute a layer when a multi-layer printed wiring board is manufactured, thereby increasing varieties of the multi-layer printed wiring board production.

Furthermore, as the metal clad dielectric used in the step a, a four-layer structure metal clad dielectric 2c comprising a three-layer structure of a first conductor layer/a dielectric layer/a second conductor layer, and a carrier on the second conductor layer: the first conductor layer 4a/the dielectric layer 3/the second conductor layer 4b/the carrier layer 13, may also be preferably used for manufacturing a dielectric layer constituting material. A schematic view of a sectional layer structure of this metal clad dielectric is shown in FIG. 1(c). The carrier layer improves handling property to prevent generation of defects due to handling when the three-layer of the first conductor layer/the dielectric layer/the second conductor layer is thin and is hard to handle.

Among the metal clad dielectrics mentioned above, a dielectric with the most basic layer structure has the first conductor layer 4a and the second conductor layer 4b on each side of the dielectric layer 3 as shown in FIG. 1(a). This metal clad dielectric 2a has a structure in which a metal layer is provided as a conductor layer 4 on each side of the dielectric layer 3. When the double-sided metal clad dielectric 2a is used as a starting material, dielectric strength can be measured in this state. This enables dramatic increase of production yield of a multi-layer printed wiring board to be manufactured in the end. And, in the case of using metal foils for forming the conductor layers, material and thickness thereof are not particularly limited, but a copper foil or a nickel foil are mainly used in general when special processing steps are not employed. Furthermore, material of the first conductor layer 4a and material of the second conductor layer 4b may be the same or different depending on quality design, and which causes no problem.

As a matter of course, the dielectric layer 3 of the metal clad dielectric contains material functioning as a dielectric. The case of forming the dielectric layer by coating a dielectric filler containing resin solution will be particularly explained because the greatest attention must be paid to control of film thickness etc. The dielectric filler containing resin solution generally contains the dielectric filler F. "The dielectric layer" is mainly intended to represent a layer comprising a dielectric filler and an organic agent. The organic agent mentioned here is not particularly limited as long as the organic agent makes it possible to bond the dielectric layer and a metal foil, and to maintain the shape of the dielectric layer at least. This organic agent works as a binder resin for forming a dielectric filler into the shape of a dielectric layer.

The dielectric filler is made to be present in the dielectric layer in a dispersed state, and is used for the purpose of increasing the electric capacity of a capacitor when the dielectric layer is processed into a final capacitor shape. As the dielectric filler, the dielectric powders of composite oxides having a perovskite structure such as $BaTiO_3$, $SrTiO_3$, $Pb(Zr-Ti)O_3$ (so called PZT), $PbLaTiO_3.PbLaZrO$ (so called PLZT) or $SrBi_2Ta_2O_9$ (so called SBT) are generally used. Furthermore, as the dielectric filler, first of all, powder whose particle size falls within the range of 0.1 to 1.0 μm is preferably used. Additionally, barium titanate is preferably used as the dielectric filler, among the composite oxides having a perovskite structure in consideration of precision in the production as a powder at the present stage. As the dielectric filler in this case, either calcined barium titanate or uncalcined barium titanate can be used. When a high dielectric constant is intended to be attained, calcined barium titanate is preferably used. But, any of these two can be used selectively according to the quality of design for the printed wiring board product.

Furthermore, it is most preferable that the dielectric filler of barium titanate has a cubic crystal structure. Barium titanate has cubic and tetragonal crystal structures. Use of a dielectric filler of barium titanate having a cubic crystal structure stabilizes the dielectric constant value of a dielectric layer to be obtained finally as compared to the case of using a dielectric filler of barium titanate having only a tetragonal crystal structure. Accordingly, it can be said at least that it is necessary to use a barium titanate powder that has both cubic and tetragonal crystal structures.

The organic agent and the dielectric filler described above are mixed to obtain a dielectric filler containing resin solution, which is used as a varnish for forming a dielectric layer of an embedded capacitor layer of a printed wiring board. In this case, a desirable blending ratio of the organic agent and the dielectric filler is the dielectric filler content of 75 wt % to 85 wt % and the balance of the organic agent. When the dielectric filler content exceeds 85 wt %, the organic agent content becomes less than 15 wt %. This causes a loss of adhesion between the dielectric filler containing resin and a copper foil to be laminated to the resin, and thus dropping off of filler particles tends to occur. On the other hand, when the organic agent content exceeds 25 wt % and the dielectric filler content is less than 75 wt %, adhesion to the copper foil is not improved, and which lacks validity in view of ensuring high dielectric constant.

Figure 2:
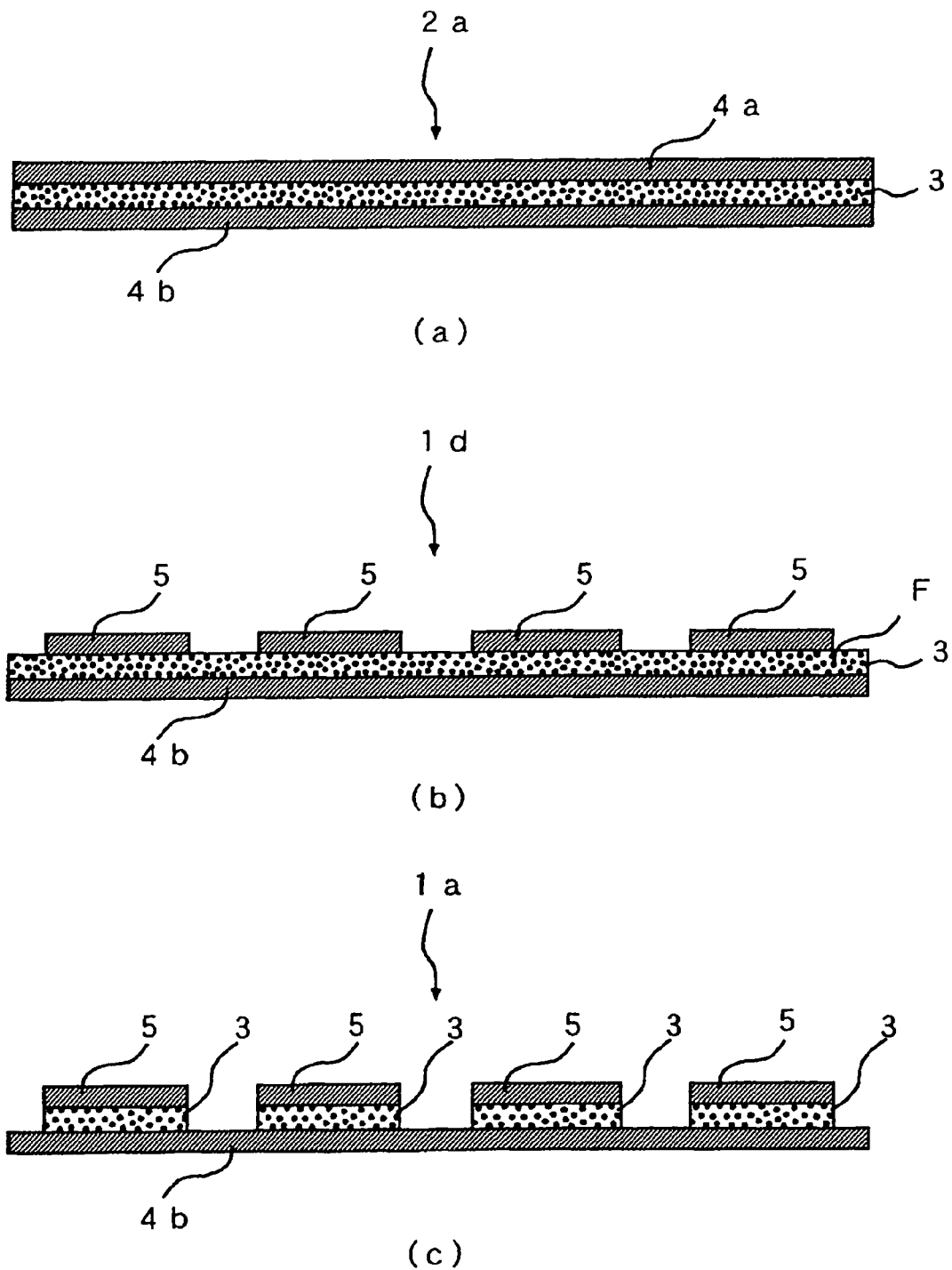
FIG. 2 is a schematic view showing flow for manufacturing a multi-layer printed wiring board with an embedded capacitor circuit (FIG. 2 includes a process for manufacturing a dielectric layer constituting material)

Next, formation of the first electrode circuit 5 will be explained. In order to form the shape of the first electrode, an etching method is generally employed. When the etching method is used for this processing, an etching resist layer is provided on the conductor layer 4 by using a dry film, a liquid resist, etc. that can be used as an etching resist; a resist pattern is exposed on the etching resist and developed; and unnecessary area of the conductor layer (a metal layer) is dissolved and removed by an etching solution, to form the first electrode circuit 5 as shown in FIG. 2(b). This first electrode circuit 5 faces the second conductor layer 4b on the opposite side across the dielectric layer 3.

Step b: a step for removing the dielectric layer exposed among the first electrode circuits. FIG. 2(c) shows the state of a dielectric layer constituting material 1a obtained by removing the dielectric layer exposed among the first electrode circuits. As for how to remove the dielectric layer, several methods can be applicable, but either of the following two methods is preferably adopted. One is a method to use a desmear treatment, which represents chemical treatments. The other is to use a blasting treatment, in particular wet blasting treatment, which represents mechanical treatments.

The former case for using a desmear treatment will be explained. The de-smear treatment is a treatment using a de-smear solution for removing burr resin (smear), which is generated when a via hole to be a through hole of a printed wiring board is processed with a drill. As for the solution, widely and commercially available solutions may be used. By using the desmear solution, organic components of the dielectric layer exposed in gaps among circuits are dissolved to remove the dielectric layer. The dielectric layer contains a little amount of organic components as mentioned above, and the organic components can be easily dissolved by a de-smear solution. When the desmear treatment is conducted, it is desirable to strip the etching resist layer beforehand used in etching for forming the first electrode circuit.

The latter blasting treatment contains both the dry blasting treatment and the wet blasting treatment. However, the wet blasting treatment is preferably adopted in considering of finished state of abraded surface after a blasting treatment is conducted and reducing damage to the circuit surface. In the wet blasting treatment, a high-velocity stream of an abrasive fluid (slurry) in which abrasive of fine grain powder is dispersed strikes a surface to be abraded, whereby abrading of narrow area has become possible. The wet blasting treatment has a feature that the treatment can obtain extremely precise and less damaging abrading when compared with the dry blasting treatment conducted under dry environment. By using the wet blasting treatment, the dielectric layer exposed in gaps among circuits is abraded for removing, to remove unnecessary dielectric layer. In the blasting treatment, the exposed dielectric layer is preferably removed according to processes shown in FIG. 5 in order to prevent damage to circuit parts due to impact of an abrasive. That is, after etching for forming a first electrode circuit is finished, a blasting treatment is conducted without stripping an etching resist layer 21 as shown in FIG. 5(I), to obtain the state shown in FIG. 5(II). In this way, the etching resist layer 21 works as a buffer layer against an impacting abrasive to prevent the first electrode circuit from being damaged. After that, the resist is stripped to obtain the state shown in FIG. 5(III).

[Embodiments of a Dielectric Layer Constituting Material]

A dielectric layer constituting material obtained by the manufacturing method of a dielectric layer constituting material is roughly divided into three types.

The first dielectric layer constituting material is manufactured by using a metal clad dielectric 2a comprising a three-layer structure of a first conductor layer 4a/a dielectric layer 3/a second conductor layer 4b, and conducting the step for forming a first electrode circuit and the step for removing a dielectric layer. Thus, the first dielectric layer constituting material comprises a layer structure of a first electrode circuit 5, the dielectric layer 3 under the first electrode circuit 5, and the second conductor layer 4b. This layer structure is shown in FIG. 2(c). The dielectric layer constituting material can be used for forming an embedded capacitor circuit of a multi-layer printed wiring board by using the first electrode circuit 5 as a top electrode of a capacitor circuit and using the second conductor layer 4b as a lower electrode of the capacitor circuit as it is. In addition, it is also possible that an insulating resin layer and a conductor layer are further laminated to any one side of the first dielectric layer constituting material, and then the second conductor layer is etched to obtain a desired circuit structure.

The second dielectric layer constituting material is manufactured by using a metal clad dielectric 2b comprising a five-layer structure of a first conductor layer 4a/a dielectric layer 3/a second conductor layer 4b/an insulating layer 7/a third conductor layer 4, and conducting the step for forming a first electrode circuit and the step for removing a dielectric layer. Thus, the second dielectric layer constituting material comprises a layer structure of a first electrode circuit 5, the dielectric layer 3 under the first electrode circuit 5, the second conductor layer 4b, the insulating layer 7 and the third conductor layer 4. This layer structure is shown in FIG. 16(c). In the dielectric layer constituting material, the first electrode circuit 5 can be used as a top electrode of a capacitor circuit, and the second conductor layer 4b as a lower electrode of the capacitor circuit as it is. And as shown in FIG. 16(d), the dielectric layer constituting material can be used for forming an embedded capacitor circuit of a multi-layer printed wiring board by removing a dielectric layer 3, and subsequently etching the second conductor layer 4b to form a lower electrode circuit 8.

The third dielectric layer constituting material is manufactured by using a metal clad dielectric 2c comprising a four-layer structure of a first conductor layer 4a/a dielectric layer 3/a second conductor layer 4b/a carrier layer 13, and conducting the step for forming a first electrode circuit and the step for removing a dielectric layer. Thus, the third dielectric layer constituting material is characterized by comprising a layer structure of a first electrode circuit 5, the dielectric layer 3 under the first electrode circuit 5, the second conductor layer 4b, and the carrier layer 13. The presence of the carrier layer 13 ensures excellent handling property even though the total thickness of the first conductor layer 4a/the dielectric layer 3/the second conductor layer 4b is thin. The layer structure is shown in FIG. 13(a). The dielectric layer constituting material may be used with the carrier layer 13 remained as it is as shown in FIG. 13(c), after removing the dielectric layer followed by etching the second conductor layer 4b to form the shape of a second electrode circuit 8. Or, the carrier layer 13 may be removed after the dielectric layer constituting material is laminated to other substrate or an inner layer core material. That is, the dielectric layer constituting material can also be used for forming an embedded capacitor circuit layer of a multi-layer printed wiring board.

In the dielectric layer constituting material described above, thicknesses of the first conductor layer 4a, the dielectric layer 3, the second conductor layer 4b, the insulating layer 7, the third conductor layer 4, and the carrier layer 13 are not particularly limited. The dielectric layer constituting material has no dielectric layer in the area that does not require the dielectric layer. Therefore, even though a signal circuit is formed in the same surface where a capacitor circuit is formed of a embedded capacitor layer manufactured by using the dielectric layer constituting material, dielectric loss at transferring signals is small, other circuit devices such as an inductor can be buried, and thus limiting conditions on circuit design can be considerably free. Furthermore, dielectric strength can be measured at the stage of a double-sided metal clad dielectric having a conductor layer on each side of a dielectric layer. And thus, a multi-layer printed wiring board with an embedded capacitor circuit obtained by using the dielectric layer constituting material obtained by the manufacturing method is produced at high yield and has extremely high quality. Incidentally, thicknesses of the first conductor layer 4a, the dielectric layer 3, the second conductor layer 4b, the insulating layer 7, the third conductor layer 4, and the carrier layer 13 are not particularly limited.

[Embodiments of Manufacturing a Capacitor Circuit Forming Piece]

A method for manufacturing a capacitor circuit forming piece using the dielectric layer constituting material is not particularly limited as long as a second electrode can be formed at a position of a second conductor layer facing to a first electrode that is previously formed locating in the dielectric layer constituting material across a dielectric layer. However, the method for manufacturing a capacitor circuit forming piece according to the present invention includes the following three manufacturing methods because a metal clad dielectric used as a starting material includes at least three ideas.

Figure 19:
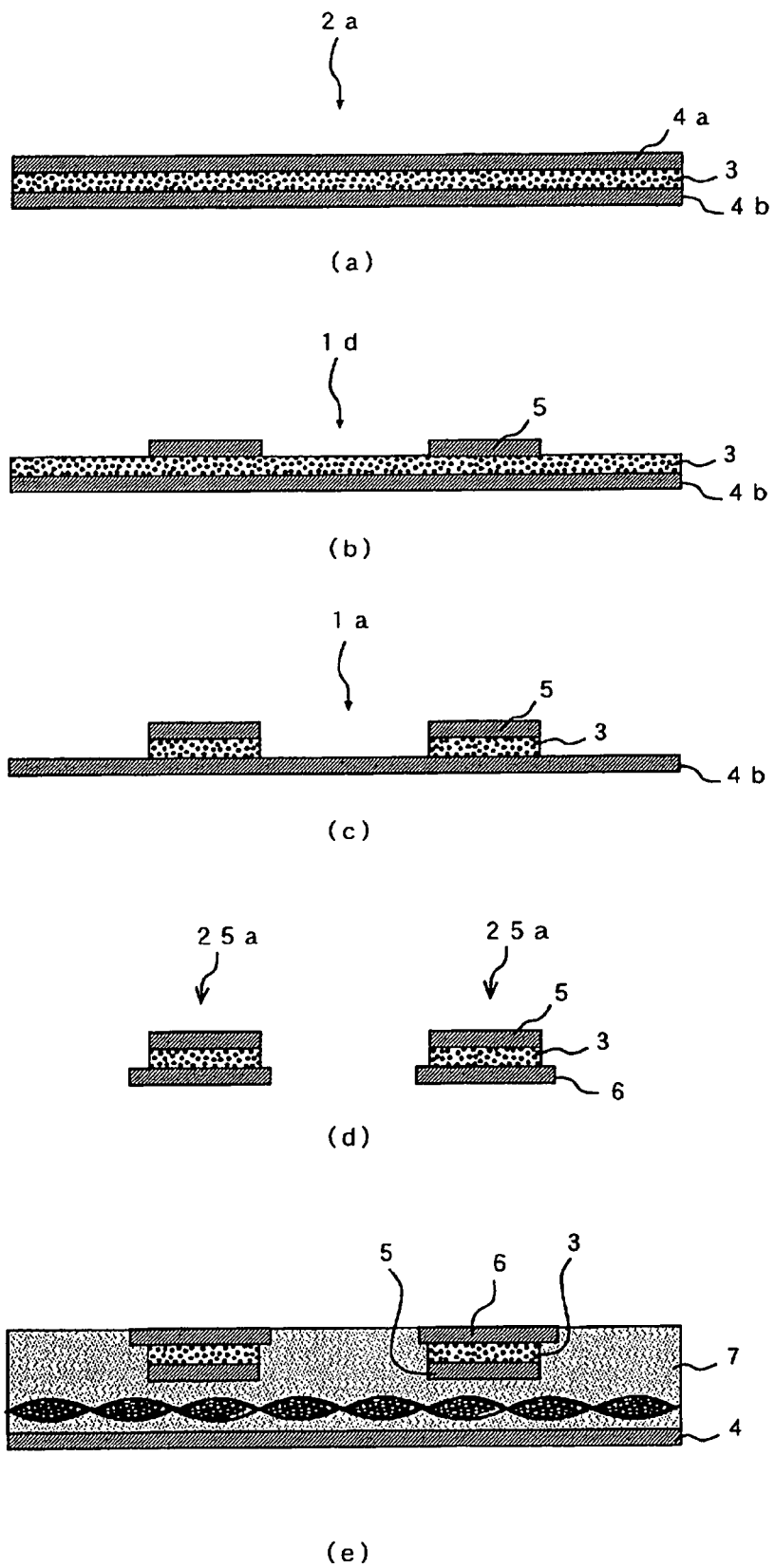
FIG. 19 is a schematic view showing flow for manufacturing a multi-layer printed wiring board with an embedded capacitor circuit using a chip-shaped capacitor circuit forming piece.
Figure 22:
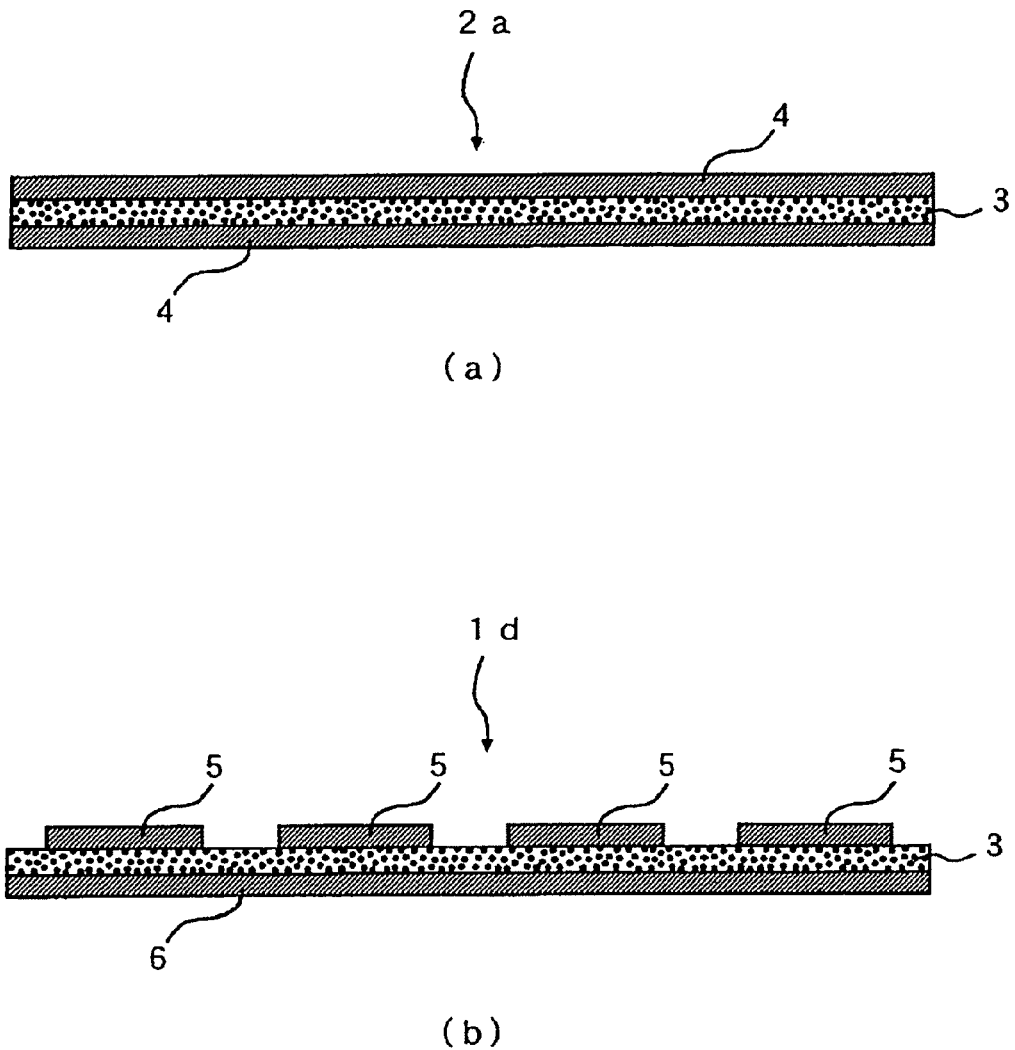
FIG. 22 is a schematic view showing flow for manufacturing a multi-layer printed wiring board with an embedded capacitor circuit according to a conventional method.
Figure 24:
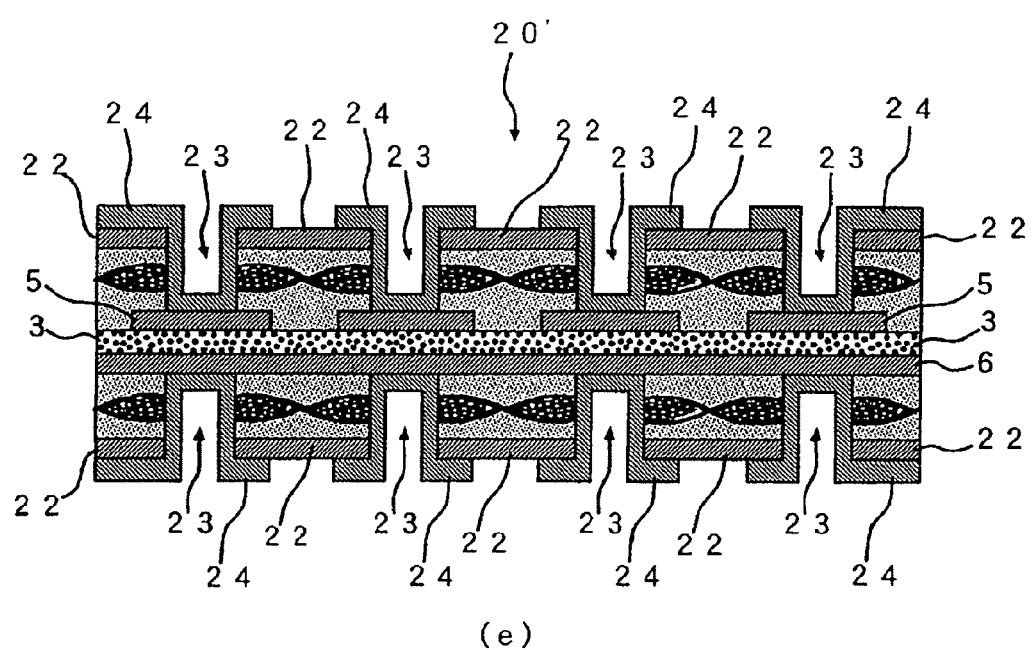
FIG. 24 is a schematic view showing flow for manufacturing a multi-layer printed wiring board with an embedded capacitor circuit according to a conventional method.

In the first method for manufacturing a capacitor circuit forming piece, a first electrode circuit 5 is formed as shown in FIG. 19(b) according to the method mentioned above by using a metal clad dielectric 2 comprising a three-layer structure of a first conductor layer 4a/a dielectric layer 3/a second conductor layer 4b shown in FIG. 19(a) (=FIG. 1(a)); and exposed dielectric layer 3 is removed as shown in FIG. 19(c) to manufacture a dielectric layer constituting material 1. Then in order to form the second conductor layer 4b of the dielectric layer constituting material 1 to be a circuit with a desired shape, unnecessary area of the second conductor layer 4b is removed to form a second electrode circuit 6. Thus, a chip-shaped capacitor circuit forming piece 25 shown in FIG. 19(d) is manufactured.

In the second method for manufacturing a capacitor circuit forming piece, a first electrode circuit 5 is formed as shown in FIG. 16(b) by using a metal clad dielectric 2' comprising a five-layer structure of a first conductor layer 4a/a dielectric layer 3/a second conductor layer 4b/an insulating layer 7/a third conductor layer 4 shown in FIG. 16(a) (=FIG. 1(b)); and exposed dielectric layer is removed as shown in FIG. 16(c) to manufacture a dielectric layer constituting material 1. Then in order to form the second conductor layer 4b of the dielectric layer constituting material 1 to be a circuit with a desired shape, unnecessary area of the second conductor layer 4b is removed to form a second electrode circuit 6. Thus, a sheet-shaped capacitor circuit forming piece 17a comprising a layer structure of a capacitor circuit layer 18/an insulating layer 7/a third conductor layer 4 shown in FIG. 16(d) is manufactured.

In the third method for manufacturing a capacitor circuit forming piece, a dielectric layer constituting material 1c is manufactured according to the method mentioned above by using a metal clad dielectric comprising a four-layer structure of a first conductor layer 4a/a dielectric layer 3/a second conductor layer 4b/a carrier layer 13 shown in FIG. 1(c). Furthermore, unnecessary area of the second conductor layer of the dielectric layer constituting material 1c is removed to form a second electrode circuit 6 as shown in FIG. 20(a). Thus, a sheet-shaped capacitor circuit forming piece 17b comprising a layer structure of a capacitor circuit layer 18/a carrier layer 13 is manufactured.

[Embodiments of a Capacitor Circuit Forming Piece According to the Present Invention]

The capacitor circuit forming piece according to the present invention is roughly divided into three types as with the dielectric layer constituting material because the capacitor circuit forming piece is obtained by further processing the dielectric layer constituting material 1a, 1b, and 1c as mentioned above.

As for the first capacitor circuit forming piece, a metal clad dielectric 2a comprising a three-layer structure of a first conductor layer 4a/a dielectric layer 3/a second conductor layer 4b shown in FIG. 19(a) is used; a first electrode circuit 5 is formed according to the method mentioned above to obtain the state shown in FIG. 19(b); and subsequently exposed dielectric layer 3 is removed to manufacture a dielectric layer constituting material 1a shown in FIG. 19(c). Then in order to form the second conductor layer 4b of the dielectric layer constituting material 1a into a second electrode circuit 6, unnecessary areas (positions) of the second conductor layer 4b are removed, whereby chip-shaped capacitor circuit forming pieces 25 are obtained in the state of being separated individually. This chip-shaped capacitor circuit forming pieces 25 can be used as chip-shaped capacitor circuits which are separately buried in any given positions in the insulating layer 7 as shown in FIG. 19(e) by laminating the chip-shaped capacitor circuit forming pieces 25 to a third conductor layer by using an anisotropic conductor film, an insulating resin sheet, or a prepreg.

Furthermore, the chip-shaped capacitor circuit forming piece 25 can also be used as the piece with a resin carrier 26 by laminating PET, polyimide resin, etc. to a first electrode circuit 5 by using an adhesive as shown in FIG. 20(a) at the stage of the dielectric layer constituting material 1a. In this case, as shown in FIG. 20(b), a patterned etching resist layer 21 is provided on the second conductor layer 4b, and the second conductor layer 4b is etched to obtain the state shown in FIG. 20(c). Then with maintaining this state, an insulating layer 7, for example glass-epoxy prepreg, and a metal layer 4 are bonded to, and subsequently releasing and removing the resin carrier 26 to obtain the state shown in FIG. 20(d). Incidentally, as the resin substrate 26, an etching resist material used for forming the etching resist layer 21 may also be used. In this case, droplets of an etching solution etc. which damage the previously-formed first electrode circuit 5 are prevented when the second conductor layer 4b is etched, whereby the chip-shaped capacitor circuit forming pieces 25 separated individually shown in FIG. 19(d) come to have high quality.

Figure 15:
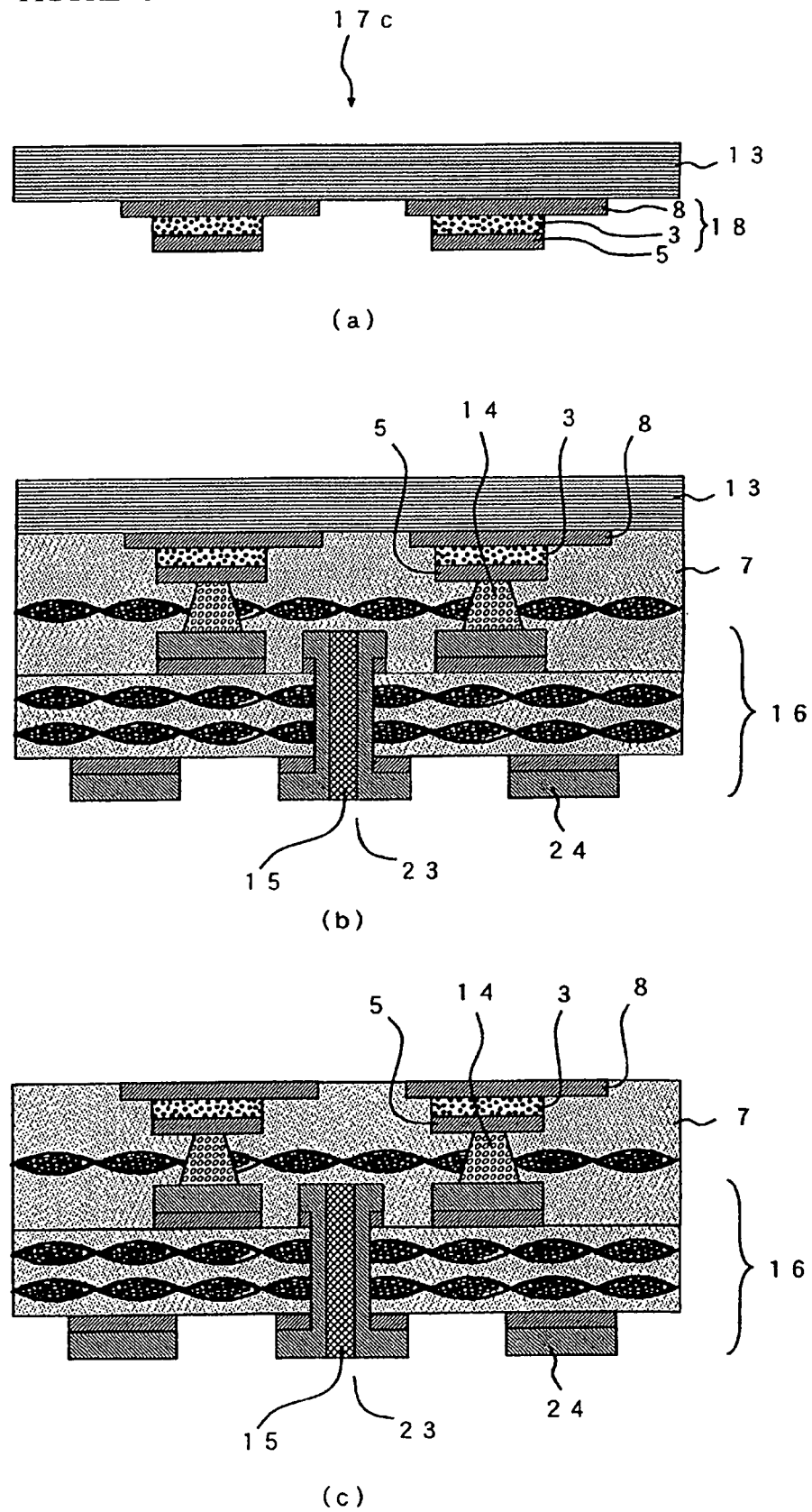
FIG. 15 is a schematic view showing flow for manufacturing a multi-layer printed wiring board with an embedded capacitor circuit in which a second electrode is buried in an insulating layer, and a first electrode and an inner layer circuit is connected.

As for the second capacitor circuit forming piece, a metal clad dielectric 2b comprising a five-layer structure of a first conductor layer 4a/a dielectric layer 3/a second conductor layer 4b/an insulating layer 7/a third conductor layer 4 shown in FIG. 16(a) is used; a first electrode circuit 5 is formed according to the method mentioned above to obtain the state shown in FIG. 16(b); and subsequently exposed dielectric layer 3 is removed to manufacture a dielectric layer constituting material 1b shown in FIG. 16(c). Then in order to form the second conductor layer 4b of the dielectric layer constituting material 1b into a second electrode circuit 6, unnecessary areas (positions) of the second conductor layer 4b are removed, whereby a sheet-shaped capacitor circuit forming piece 17a comprising a layer structure of a capacitor circuit layer 18/an insulating layer 7/a third conductor layer 4 shown in FIG. 16(d) is obtained. The sheet-shaped capacitor circuit forming piece 17a comprising such a layer structure can be used for multi-layer printed wiring boards by a process similar to what is shown in FIG. 15.

As for the third capacitor circuit forming piece, a metal clad dielectric 2c comprising a four-layer structure of a first conductor layer 4a/a dielectric layer 3/a second conductor layer 4b/a carrier layer 13 shown in FIG. 1(c) is used; a first electrode circuit 5 is formed according to the method mentioned above; and subsequently exposed dielectric layer 3 is removed (drawings showing these processes are omitted) to manufacture a dielectric layer constituting material 1c shown in FIG. 13(a). Then as shown in FIG. 13(b) as an example, an etching resist layer 21 is formed on the first electrode circuit 5 and unnecessary area of the second conductor layer 4b is removed to form a second electrode circuit (which is shown as a lower electrode 8 in FIG. 13), whereby a sheet-shaped capacitor circuit forming piece 17b comprising a layer structure of a capacitor circuit layer 18/a carrier layer 13 is obtained. This sheet-shaped capacitor circuit forming piece 17b comprising a layer structure of a capacitor circuit layer 18/a carrier layer 13 can be made into the individually-separated chip-shaped capacitor circuit forming pieces 25 as with what is mentioned above by further releasing the carrier layer 13. In addition, assuming that the piece 17b is in the state in which the chip-shaped capacitor circuit forming pieces 25 are bonded temporarily to a resin carrier 26, such a method is also preferably used: in the state of the capacitor circuit layer 18/the carrier layer 13, the capacitor circuit layer 18 is laminated to bury in a base (for example, an insulating layer comprising a prepreg which is used when bonding to an inner layer core material), and then the carrier layer is released.

[A Multi-Layer Printed Wiring Board with an Embedded Capacitor Circuit According to the Present Invention]

A multi-layer printed wiring board with an embedded capacitor circuit can be manufactured by using a dielectric layer constituting material and/or a capacitor circuit forming piece according to the present invention by popular methods. Such a multi-layer printed wiring board is a product with an embedded capacitor circuit with high quality. The method for manufacturing a multi-layer printed wiring board mentioned here is not particularly limited. And an insulating layer and a conductor layer are formed on each side of a dielectric layer constituting material, and via holes for connecting a capacitor piece and an outer layer circuit may be formed to have any shape at any given time by popular methods.

When a multi-layer printed wiring board is manufactured by bonding a dielectric layer constituting material and/or a capacitor circuit forming piece to a core material in which an inner layer circuit is formed beforehand, as a procedure connecting the dielectric layer constituting material and/or the capacitor circuit forming piece and the inner layer circuit, popular methods such as use of an anisotropic conductor film, the pierced bump method or the laser via method can be adopted. Furthermore, multi layers can also be easily formed by combining multiple dielectric layer constituting materials and/or capacitor circuit forming pieces by conventional technology.

Figure 4:
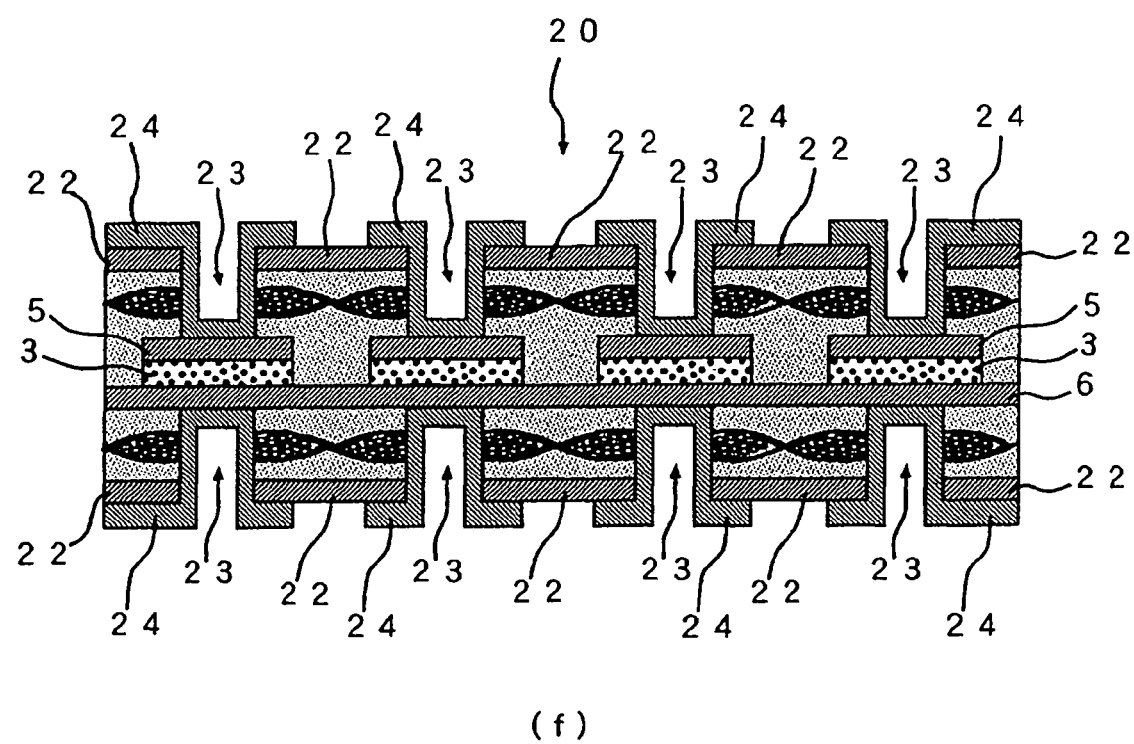
FIG. 4 is a schematic view showing flow for manufacturing a multi-layer printed wiring board with an embedded capacitor circuit.

In the most popular process for manufacturing a multi-layer printed wiring board with an embedded capacitor circuit, when an insulating layer and a conductor layer are formed on each side of a capacitor circuit forming piece, most commonly used prepregs 7 and metal foils 4 are used as shown in FIG. 3(d) to obtain the state shown in FIG. 3(e); required via hole processing etc. are conducted; and an outer circuit 22 is formed by processing a metal foil locating at an outer layer on each side. Thus, a multi-layer printed wiring board 20 shown in FIG. 4(f) is manufactured. Incidentally, in the drawings, the multi-layer printed wiring board 20 is shown in the state that via holes 23 is obtained and plated layers 24 are formed to ensure interlayer connection.

In the above process, it is also possible that core materials in which inner layer circuits are formed beforehand are bonded instead of the metal foils 4 shown in FIG. 3(d) by using anisotropic conductor films instead of the prepregs 7; or a core material in which an inner layer circuit is formed beforehand and pierced bumps are formed in required positions and a prepreg or a resin sheet are used to form a new core material.

Figure 7:
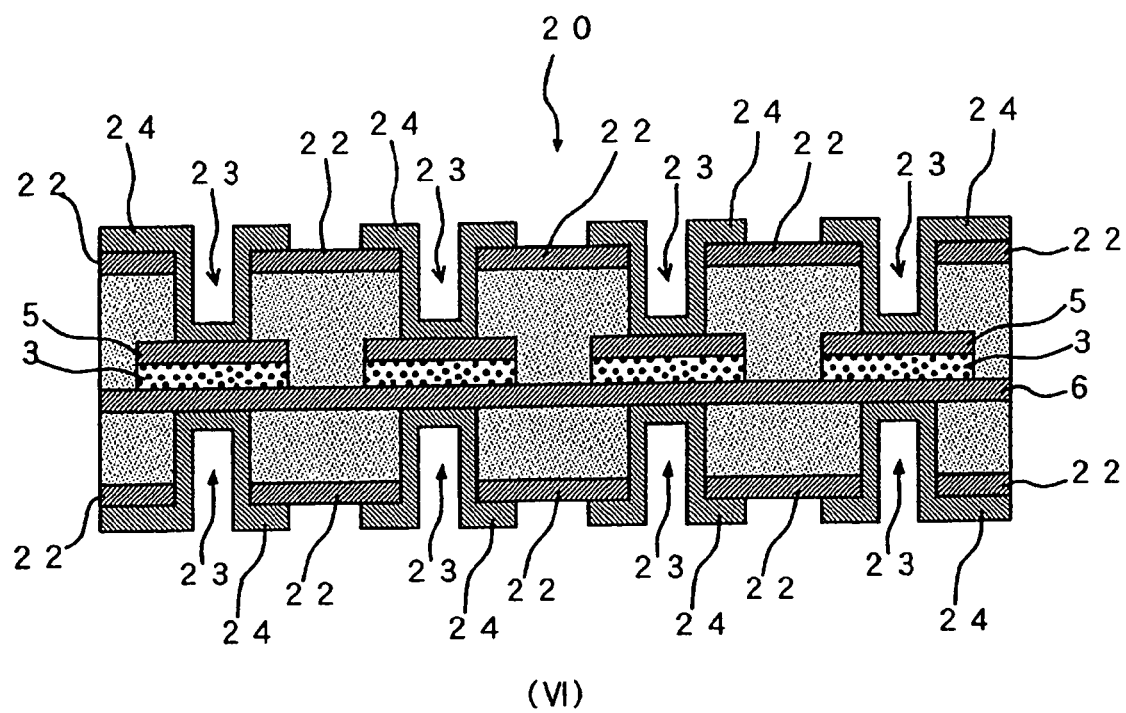
FIG. 7 is a schematic view showing flow for manufacturing a multi-layer printed wiring board with an embedded capacitor circuit (in the case of laminating a resin coated metal foil to each side of a dielectric layer constituting material)

Furthermore, as shown in FIG. 6(IV), it is also preferable that a resin coated metal foil 9 is laminated to each side of the dielectric layer constituting material obtained in FIG. 2(c) to obtain the state shown in FIG. 6(V). Then required via hole processing etc. are conducted; and an outer circuit 22 is formed by processing a metal foil locating at an outer layer on each side. Thus, a multi-layer printed wiring board shown in FIG. 7 (VI) is manufactured. Incidentally, the resin coated metal foil 9 shown in FIG. 6(IV) has a resin layer 10 for forming an insulating layer on one side of the metal foil.

Figure 9:
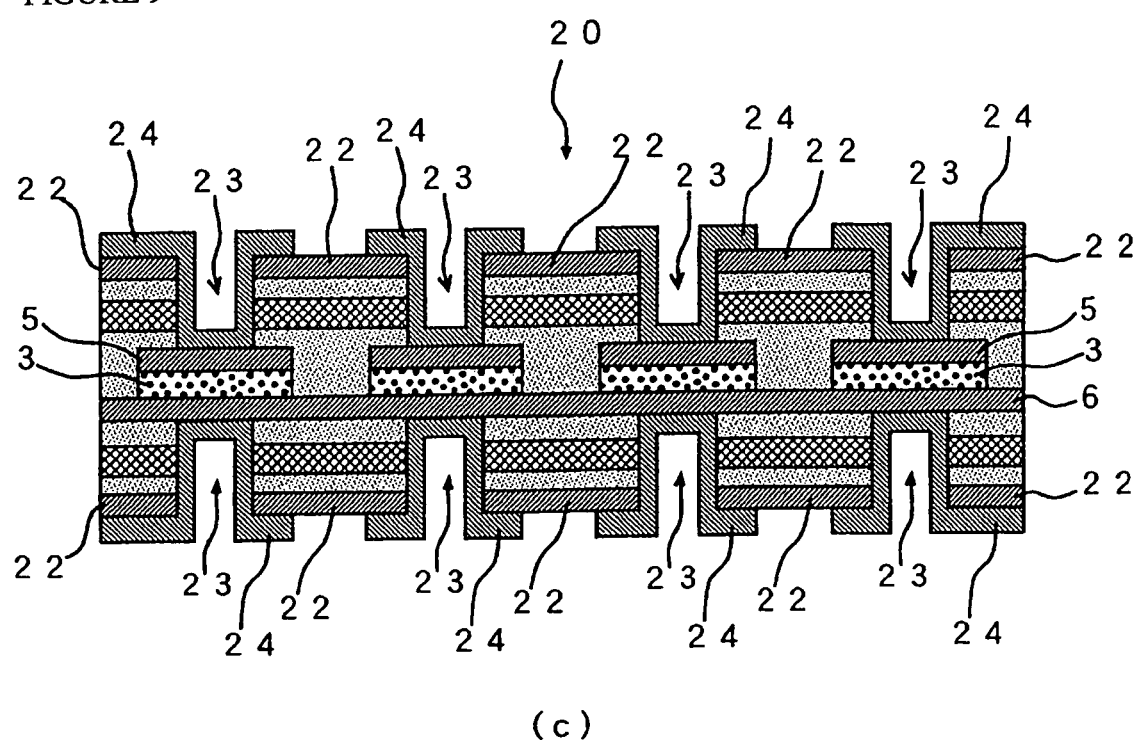
FIG. 9 is a schematic view showing flow for manufacturing a multi-layer printed wiring board with an embedded capacitor circuit (in the case of laminating a resin coated metal foil with skeletal material to each side of a dielectric layer constituting material)

Furthermore, as shown in FIG. 8(a), it is also preferable that a resin coated metal foil with a skeletal material 11 is laminated to each side of the dielectric layer constituting material obtained in FIG. 2(c) to obtain the state shown in FIG. 8(b). Then required via hole formation etc. are processed; and an outer layer circuit 24 is formed by processing a metal foil locating at an outer layer on each side. Thus, a multi-layer printed wiring board 20 shown in FIG. 9(c) is manufactured. Incidentally, in the drawings, the multi-layer printed wiring board 20 is shown in the state that via holes 23 is obtained and plated layers 24 are formed for interlayer connection. In addition, the resin coated metal foil with a skeletal material 11 shown in FIG. 8(a) has a resin layer containing a skeletal material 12 for forming an insulating layer on one side of the metal foil 4, and are commonly used for the purpose of ensuring enough thicknesses of insulating layers.

FIG. 10(a) to FIG. 12(g) show a process for forming a circuit after bonding of metal to be an inner layer circuit in order to use a second electrode circuit surface as a part of the inner layer circuit. On the other hand, in the case of burying a wiring pattern of the second electrode circuit for the purpose of preventing delamination etc., multi layers are preferably manufactured by using a capacitor circuit forming pieces shown in FIG. 13(c) and adopt a process shown in FIG. 14 or FIG. 15. In this case, it is recommended that a metal foil with carrier is used as a second conductor layer, and the carrier is released to have a sectional layer structure shown in FIG. 14(c) or FIG. 15(c).

Furthermore, a dielectric layer constituting circuit may be formed according to the method in FIG. 16 in which a third conductor layer is laminated as the carrier layer, or processes in FIG. 17 or FIG. 18 in which a core material in which an inner layer circuit is formed beforehand is laminated.

Example 1

Manufacturing a Dielectric Layer Constituting Material

Step a (a step for forming a first electrode circuit): At the beginning, a binder resin solution was prepared. In the preparation of the binder resin solution, the raw materials used were 39 parts by weight of phenol novolac type epoxy resin, 39 parts by weight of a solvent soluble aromatic polyamide resin polymer BP3225-50P commercially available as a blended varnish mixed with cyclopentanone as solvent from Nippon Kayaku Co., Ltd. To finish preparation of a resin mixture having the blending ratios shown below, curing agent MEH-7500a, novolac type phenolic resin from Meiwa Plastic Industries, Ltd., and a curing accelerator 2E4MZ from SHIKOKU CHEMICALS CORPORATION were added to the varnish.

The composition of the binder resin:

| Phenol novolac type epoxy resin | 39 parts by weight |
| Aromatic polyamide resin polymer | 39 parts by weight |
| Novolac type phenolic resin | 22 parts by weight |
| Curing accelerator | 0.1 parts by weight |

The resin mixture was adjusted to the solid resin content of 30 wt % by further using methyl ethyl ketone to prepare the binder resin solution. Then barium titanate powder, which is a dielectric filler F having the powder characteristics described below, was mixed and dispersed in the binder resin, and thus a dielectric filler containing resin solution having the composition described below was prepared.

Powder characteristics of the dielectric filler:

| Average particle size ($D_{IA}$) | 0.25 µm |
| Weight cumulative particle size ($D_{50}$) | 0.5 µm |
| Coagulation degree ($D_{50}/D_{IA}$) | 2.0 |

Dielectric filler containing resin solution:

| Binder resin solution | 83.3 parts by weight |
| Barium titanate powder | 100 parts by weight |

The dielectric filler containing resin solution prepared as described above was coated by using an edge coater onto the one side of a first copper foil so as to form a dielectric filler containing resin film, followed by air drying for 5 minutes, then a drying processing was conducted for 3 minutes in a heated atmosphere at 140° C., and thus a 20 µm thick dielectric layer in B-stage was formed.

After finishing of the formation of the dielectric layer, one side of a second copper foil (an electro-deposited copper foil similar to the first copper foil) was laid on the dielectric layer to be laminated, and a hot pressing was conducted under the heating condition at 180° C. for 60 minutes to get a metal clad dielectric having a copper foil layer on each side of the dielectric layer. At this stage, interlayer dielectric strength was measured, and excellent results were obtained in tests applying a voltage of 500 volts. In addition, measuring dielectric constant of the dielectric layer showed an extremely excellent value of ∈=20. It means that a capacitor with a high electric capacity was obtained.

The first copper foil on one side of thus prepared metal clad dielectric was polished, and a dry film was laminated on the surface of the metal clad laminate to form an etching resist layer. Then etching patterns for forming a first electrode circuit were exposed on the etching resist layers formed on both side and developed. Then, etching was conducted by using a cupric chloride etchant to form the first electrode circuit.

Step b (a step for removing a dielectric layer): In this step for removing a dielectric layer, dielectric layer exposed in areas except circuit positions on which the etching resist is remaining on the circuit surface was removed. As for a method for removing the dielectric layer at this time, a wet blasting treatment was used: a abrasive fluid (slurry) (abrasive concentration of 14 vol %) in which an alumina abrasive, fine grain powder with a median diameter of 14 μm, was dispersed in water was shot against the surface to be abraded as a high-velocity stream from a slit nozzle of 90 mm long and 2 mm wide at a water pressure of 0.20 MPa. Thus unnecessary dielectric layer was abraded and removed. After finishing this wet blasting treatment, the etching resist was stripped, and rinsing and drying were conducted to obtain the same state as shown in FIG. 2(c). Thus a dielectric layer constituting material was obtained.

[Manufacturing a Multi-Layer Printed Wiring Board]

In the case of using the dielectric layer constituting material in which the dielectric layer is removed, in laminating multi layers, it is necessary to fill in gaps among first electrode circuits which become deep due to the removing of exposed dielectric layer. Then as shown in FIG. 3(d), in order to obtain an insulating layer and a conductor layer on each side of the dielectric layer constituting material, 100 μm thick prepregs and copper foils were laminated to the dielectric layer constituting material, and a hot pressing was conducted under the heating condition at 180° C. for 60 minutes to obtain the state shown in FIG. 3(e).

Then conductor layers in outer layers shown in FIG. 3(e) were subjected to etching process, accompanied with formation of via holes, and so on to obtain outer layer circuits 22. Thus what is shown in FIG. 4(f) was obtained. The etching method, formation of via holes and so on used at this time was the same as the etching for forming the first electrode circuit. Therefore, explanations thereof are omitted here to avoid redundant explanation. In the procedure described above, a multi-layer printed wiring board 20 comprising an embedded capacitor circuit was manufactured. As a result, an extremely excellent multi-layer printed wiring board was obtained.

Example 2

A manufacturing method used in Example 2 is basically the same as Example 1 except the method for removing the dielectric layer. Therefore, description regarding processes to be redundant explanation is omitted, and only the method for removing the dielectric layer will be explained.

In this Example, the dielectric layer was removed by a de-smear treatment. Unnecessary dielectric layer was dissolved and removed with a commercially available de-smear solution.

In the procedure mentioned above, a multi-layer printed wiring board 20 comprising an embedded capacitor circuit was manufactured. As a result, an extremely excellent multi-layer printed wiring board was obtained.

Example 3

Manufacturing a Capacitor Circuit Forming Piece with a Carrier Layer

As mentioned above, a copper foil with a carrier foil was used as the second conductor layer. The copper foil with a carrier foil comprises a peelable type and an etchable type, and either of which may be used. But the peelable type is preferably used because processes can be simplified. Among the peelable type used was the type which used no heavy metal on a bonding interface and had an organic bonding interface between the carrier foil and the conductor layer using triazole compounds having substituents such as 1,2,3-benzotriazole or carboxybenzotriazole.

A dry film was laminated to the surface of the first conductor layer (electrode circuit) of the dielectric layer constituting material in FIG. 13(a) that underwent the step a and the step b in which a dielectric layer was removed; and etching patterns were exposed and developed to obtain what is shown in FIG. 13(b). Then the first conductor layer was etched with a copper etching solution to form a first electrode pattern; etching resist was stripped with an alkaline solution; and rising was conducted to obtain a capacitor circuit forming piece with a carrier layer having the sectional shape shown in FIG. 13(c).

Example 4

1. Manufacturing a Chip-Shaped Capacitor Circuit Forming Piece 1

A punch die having a size a little larger than the first electrode pattern of the dielectric layer constituting material obtained by the method of EXAMPLE 1 (manufacturing process of a dielectric layer constituting material), in which removal of a dielectric layer was finished, and shown in FIG. 19(c) was prepared. With the punch die, the second conductor layer was punched by the press method to obtain a separated chip-shaped capacitor circuit forming pieces shown in FIG. 19(d). The chip-shaped capacitor circuit forming pieces obtained by the method had no short phenomenon between the first electrode circuit and the second electrode circuit, which is caused in the case of directly punching double-sided conductor layer clad dielectrics, and excellent results were obtained.

Example 5

2. Manufacturing a Chip-Shaped Capacitor Circuit Forming Piece 1

As shown in FIG. 20(a), a dry film was laminated and exposed to form an etching resist and supporting film on the whole surface of the first electrode pattern of the dielectric layer constituting material obtained by the method of EXAMPLE 1 (manufacturing process of a dielectric layer constituting material) in which removal of a dielectric layer was finished. Next, a dry film was applied also to the surface of the second conductor layer, and etching patterns were exposed and developed to form an etching resist of the second electrode pattern as shown in FIG. 20(b). After that, etching was conducted and the resist layer was stripped to obtain a capacitor sheet in which a second electrode circuit was formed as shown in FIG. 20(c). In this case, a nickel foil was used for the first conductor layer, and a copper foil was used for the second conductor layer. Accordingly, cupric chloride etchant etc., which is acid-based etchant, was used to etch the first conductor layer, and ammonium persulfate etc., which is alkaline-based etchant, was used to etch the second conductor layer, whereby damage to the first electrode circuit was avoided when the second electrode circuit was processed by etching. The capacitor sheet obtained by the method had no short phenomenon between the first electrode circuit and the second electrode circuit, which is caused in the case of directly punching double-sided conductor layer clad dielectrics, and excellent results were obtained.

Example 6

Manufacturing a Capacitor Sheet 2

To obtain separated chip-shaped capacitor circuit forming piece in FIG. 21(b), carrier layer of the capacitor circuit forming piece with the carrier layer having the sectional shape shown in FIG. 21(a) obtained in EXAMPLE 3 was released and removed. In the chip-shaped capacitor circuit forming piece obtained by the method, pairs of the first electrode circuits and the second electrode circuits are formed independently, and only releasing of the carrier provides a capacitor sheet. Thus the capacitor sheet had no short phenomenon between the circuits, and excellent results were obtained.

INDUSTRIAL APPLICABILITY

The dielectric layer constituting material and a capacitor circuit forming piece according to the present invention are mainly manufactured by using a metal clad dielectric, and thus dielectric strength can be measured as a metal clad dielectric. Therefore, measuring dielectric strength of the metal clad dielectric beforehand makes it possible as a dielectric layer constituting material to assure quality of capacitor properties of a multi-layer printed wiring board with an embedded capacitor circuit manufactured by using the dielectric layer constituting material and/or the capacitor circuit forming piece. Furthermore, the dielectric layer constituting material and/or the capacitor circuit forming piece according to the present invention do not have a dielectric layer in unnecessary area except in positions for forming a capacitor. Therefore, in a multi-layer printed wiring board processed from the dielectric layer constituting material and/or the capacitor circuit forming piece, a detrimental effect is not given to signal circuits etc. close to the capacitor, other circuit devices such as an inductor can be buried easily, and freedom in circuit design is expanded broadly.

The invention claimed is:

1. A method for manufacturing a dielectric layer constituting material for an embedded capacitor circuit of a multi-layer printed wiring board:
   a) forming a first electrode circuit comprising a first metal clad dielectric and an interlayer insulating layer, the first metal clad dielectric comprising a three-layer structure of a first conductor layer/a dielectric layer/a second conductor layer, the interlayer insulating layer being laminated to the first or second conductor layer after the metal clad dielectric is formed, to form a second metal clad dielectric, and etching the first conductor layer to form the first electrode circuit; and
   b) removing the dielectric layer exposed among the first electrode circuits by conducting a desmear treatment to dissolve and remove the dielectric layer to manufacture the dielectric layer constituting material.

2. The method for manufacturing a dielectric layer constituting material according to claim 1, wherein the second metal clad dielectric in a) is a five-layer structure metal clad dielectric comprising a three-layer structure of the first conductor layer/the dielectric layer/the second conductor layer, the interlayer insulating layer is laminated to the second conducting layer, and a third conductor layer across the insulating layer on the second conductor layer.

3. The method for manufacturing a dielectric layer constituting material according to claim 1, wherein the second metal clad dielectric in a) comprises the interlayer insulating layer/the first conductor layer/the dielectric layer/the second conductor layer, and a carrier on the second conductor layer.

4. A method for manufacturing a capacitor circuit forming piece that is a chip-shaped dielectric layer constituting piece, comprising manufacturing a dielectric layer constituting material by the method according to claim 1, the second metal clad dielectric comprising a three-layer structure of the first conductor layer/the dielectric layer/the second conductor layer; and further removing unnecessary area of the second conductor layer of the dielectric layer constituting material to form a second electrode circuit.

5. A method for manufacturing a capacitor circuit forming piece comprising a layer structure of a capacitor circuit layer/an insulating layer/a third conductor layer comprising manufacturing a dielectric layer constituting material by the method according to claim 1 using the second metal clad dielectric comprising a five-layer structure of the first conductor layer/the dielectric layer/the second conductor layer/the interlayer insulating layer/the third conductor layer; and further removing unnecessary area of the second conductor layer of the dielectric layer constituting material to form a second electrode circuit.

6. A method for manufacturing a capacitor circuit forming piece comprising a layer structure of a capacitor circuit layer/a carrier layer, comprising manufacturing the dielectric layer constituting material by the method according to claim 1, the second metal clad dielectric comprising the interlayer insulating layer/the first conductor layer/the dielectric layer/the second conductor layer/the carrier layer; and further removing unnecessary area of the second conductor layer of the dielectric layer constituting material to form a second electrode circuit.

7. A dielectric layer constituting material manufactured by the method according to claim 1, the first metal clad dielectric comprising a three-layer structure of the first conductor layer/the dielectric layer/the second conductor layer, wherein the material comprises a layer structure of a first electrode circuit, the dielectric layer under the first electrode circuit, and the second conductor layer.

8. A dielectric layer constituting material manufactured by the method according to claim 1, the second metal clad dielectric comprising a five-layer structure of the first conductor layer/the dielectric layer/the second conductor layer/the interlayer insulating layer/a third conductor layer, wherein the material comprises a layer structure of a first electrode circuit, the dielectric layer under the first electrode circuit, the second conductor layer, the interlayer insulating layer and the third conductor layer.

9. A dielectric layer constituting material manufactured by the method according to claim 1, the second metal clad dielectric comprising the interlayer insulating layer/the first conductor layer/the dielectric layer/the second conductor layer/the carrier layer, wherein the material comprises a layer structure of a first electrode circuit, the dielectric layer under the first electrode circuit, the second conductor layer, and the carrier layer.

10. A chip-shaped capacitor circuit forming piece manufactured by the method according to claim 4.

11. A capacitor circuit forming piece comprising a layer structure of the capacitor circuit layer/the interlayer insulating layer/the third conductor layer manufactured by the method according to claim 5.

12. A capacitor circuit forming piece comprising a layer structure of the capacitor circuit layer/the carrier layer manufactured by the method according to claim 6.

13. A multi-layer printed wiring board with an embedded capacitor circuit, wherein the circuit is obtained by using the dielectric layer constituting material according to claim 7.

14. A multi-layer printed wiring board with an embedded capacitor circuit, wherein the circuit is obtained by using the capacitor circuit forming piece according to claim 10.

15. A method for manufacturing a dielectric layer constituting material for an embedded capacitor circuit of a multi-layer printed wiring board:

a) forming a first electrode circuit comprising a first metal clad dielectric and an interlayer insulating layer, the first metal clad dielectric comprising a three-layer structure of a first conductor layer/a dielectric layer/a second conductor layer, the interlayer insulating layer being laminated to the first or second conductor layer after the metal clad dielectric is formed, to form a second metal clad dielectric, and etching the first conductor layer to form the first electrode circuit; and b) removing the dielectric layer exposed among the first electrode circuits by conducting a blasting treatment to remove the dielectric layer to manufacture the dielectric layer constituting material.

16. The method of manufacturing a dielectric layer constituting material according to claim 15, further comprising in part a) using an etching resist layer to etch the first conductor layer, further comprising in part b) stripping the etching resist layer following the blasting treatment, wherein the blasting treatment comprises wet blasting.

17. The method of manufacturing a dielectric layer constituting material according to claim 15, wherein the second metal clad dielectric in a) is a five-layer structure metal clad dielectric comprising a three-layer structure of the first conductor layer/the dielectric layer/the second conductor layer, the interlayer insulating material is laminated to the second conducting layer, and a third conductor layer across the insulating layer on the second conductor layer.

18. The method for manufacturing a dielectric layer constituting material according to claim 15, wherein the second metal clad dielectric in a) comprises the interlayer insulating layer/the first conductor layer/the dielectric layer/the second conductor layer, and a carrier on the second conductor layer.

19. A method for manufacturing a capacitor circuit forming piece that is a chip-shaped dielectric layer constituting piece, comprising manufacturing a dielectric layer constituting material by the method according to claim 15; and further removing unnecessary area of the second conductor layer of the dielectric layer constituting material to form a second electrode circuit.

20. A method for manufacturing a capacitor circuit forming piece comprising a layer structure of a capacitor circuit layer/an interlayer insulating layer/a third conductor layer, comprising manufacturing a dielectric layer constituting material by the method according to claim 15, the second metal clad dielectric comprising a five-layer structure of the first conductor layer/the dielectric layer/the second conductor layer/the interlayer insulating layer/a third conductor layer; and further removing unnecessary area of the second conductor layer of the dielectric layer constituting material to form a second electrode circuit.

21. A method for manufacturing a capacitor circuit forming piece comprising a layer structure of a capacitor circuit layer/a carrier layer, comprising manufacturing a dielectric layer constituting material by the method according to claim 15, the second metal clad dielectric comprising the interlayer insulating layer/the first conductor layer/the dielectric layer/the second conductor layer/a carrier layer; and further removing unnecessary area of the second conductor layer of the dielectric layer constituting material to form a second electrode circuit.

* * * * *